United States Patent
Itoh et al.

(10) Patent No.: US 6,306,550 B1
(45) Date of Patent: Oct. 23, 2001

(54) COLOR FILTERS

(75) Inventors: Hisato Itoh, Yokohama; Akio Karasawa, Zushi; Kenichi Sugimoto, Yokohama, all of (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 09/344,350

(22) Filed: Jun. 25, 1999

Related U.S. Application Data

(62) Division of application No. 09/087,845, filed on Jun. 1, 1998, now Pat. No. 5,948,597, which is a division of application No. 08/653,252, filed on May 24, 1996, now Pat. No. 5,789,137, which is a division of application No. 08/223,605, filed on Apr. 6, 1994, now Pat. No. 5,578,419, which is a continuation-in-part of application No. 07/987,960, filed on Dec. 22, 1992, now abandoned.

(30) Foreign Application Priority Data

Dec. 12, 1991 (JP) .................................... 3-328474

(51) Int. Cl.$^7$ ........................... G02B 5/20; G02F 1/1335
(52) U.S. Cl. .................................................. 430/7
(58) Field of Search .................... 430/7; 349/106

(56) References Cited

U.S. PATENT DOCUMENTS

| | | |
|---|---|---|
| 3,073,699 | 1/1963 | Firestine . |
| 3,591,661 | 7/1971 | Rogers . |
| 3,627,472 | 12/1971 | Parsons et al. . |
| 3,646,003 | 2/1972 | Lamure . |
| 4,132,841 | 1/1979 | Champenois . |
| 4,272,620 | 6/1981 | Ichimura . |
| 4,273,858 | 6/1981 | Nagajawa et al. . |
| 4,381,261 | 4/1983 | Bonnet . |
| 4,436,852 | 3/1984 | Baebler . |
| 4,614,521 | 9/1986 | Niwa et al. . |
| 4,619,990 | 10/1986 | Elmasry . |
| 4,808,501 | 2/1989 | Chiulli . |
| 4,997,897 | 3/1991 | Melpolder . |
| 5,009,986 | 4/1991 | Kawaguchi et al. . |
| 5,041,511 | 8/1991 | Yanagawa et al. . |
| 5,055,602 | 10/1991 | Melpolder . |
| 5,212,027 | 5/1993 | Eitzbach et al. . |

FOREIGN PATENT DOCUMENTS

| | | |
|---|---|---|
| 627932 | 9/1961 | (CA) . |
| 0 098 522 | 1/1984 | (EP) . |
| 0 168 694 | 1/1986 | (EP) . |
| 0 300 770 | 1/1989 | (EP) . |
| 0 359 934 | 3/1990 | (EP) . |
| 0 371 398 | 6/1990 | (EP) . |
| 756879 | 9/1956 | (GB) . |
| 982709 | 2/1965 | (GB) . |
| 2038849 | 7/1980 | (GB) . |
| 60-184887 | 9/1985 | (JP) . |
| 62-207311 | 9/1987 | (JP) . |

OTHER PUBLICATIONS

Guthrie, J.T., "Polymeric Colorants," *Review of Progress in Coloration*, vol. 20, 1990, pp. 40–52.

Nikkei New Material, pp. 48–56 (Feb. 25, 1991).

*Primary Examiner*—John A. McPherson
(74) *Attorney, Agent, or Firm*—Millen White Zelano & Branigan, P.C.

(57) ABSTRACT

Dyes suitable for use in the fabrication of color filters are described which contain one or more photopolymerizable substituents preferably represented by the following formula:

$$D\text{---}(A\text{---}Y n^1) n^2 \qquad (1)$$

where D represents a chromphoric nucleus, A denotes a connecting group, Y means the photopolymerizable group, $n^1$ is 1–10,000, and $n^2$ stands for an integer of 1–10. Also described are photosensitive resist resin compositions containing the dyes as well as color filters fabricated by curing the photosensitive resist resin compositions.

7 Claims, 3 Drawing Sheets

COLOR FILTERS

CROSS-REFERENCE TO RELATED APPLICATION

This is a divisional of application Ser. No. 09/087,845 filed Jun. 1, 1998 U.S. Pat. No. 5,948,587; which is a divisional of Ser. No. 08/653,252 filed May 24, 1996 U.S. Pat. No. 5,789,137 (patented) which is a divisional of Ser. No. 08/223,605 filed Apr. 6, 1994 U. S. Pat. No. 5,578,419 (patented), which is a continuation-in-part of Ser. No. 07/987,960 filed Dec. 22, 1992 (abandoned).

BACKGROUND OF THE INVENTION

1) Field of the Invention

This invention relates to dyes for color filters suitable for use in liquid crystal television sets, color image pickup tubes and color copying machines, photosensitive resist resin compositions containing the dyes, and color filters fabricated by curing the resin compositions.

2) Related Art of the Invention

Known fabrication processes of color filters include printing processes utilizing the principle of printing, dyeing processes and pigment printing processes, both making use of photolithography, and electrodeposition processes involving electrochemical deposition of a dye ("Nikkei New Material", 48–56 (Feb. 25, 1991)).

Fabrication of a filter by a dyeing process comprises, as shown in FIG. 1 by way of example, the following steps: (1) coating a glass substrate with a coating formulation which is formed of a water-soluble dyeable high-molecular material, such as gelatin or casein, and to which has been imparted photosensitivity by the addition of a bichromate, (2) exposing the thus-formed coating to ultraviolet rays through a photomask, (3) developing the thus-exposed coating to form a pattern, (4) coloring the pattern with an acid dye, (5) subjecting the thus-colored pattern to color-mixing protection, and (6) repeating steps (1) to (5) until the other two colors are applied to the glass substrate. The color filter obtained by the dyeing process has excellent pattern resolution and dimensional accuracy, superb light transmission and high lightness. Such a dyeing process is, however, accompanied by the following drawbacks:

(1) If the glass substrate is dyed with the second color without applying color protection subsequent to its coloration with the first color, the dye for the second color migrates into the filter layer of the first color so that the spectral characteristics are deteriorated. To avoid this problem, it is necessary to apply a color protection film with an acryl, urethane or epoxy resin or to subject the surface of the dyed medium to chemical treatment with tannic acid or the like.

(2) The heat resistance is insufficient due to the use of gelatin or casein as the base of the photosensitive resin.

On the other hand, fabrication of a filter by a pigment printing process makes use of a pigment which is employed for heat-resistant paints or for the coloration of plastics, and as depicted in FIG. 2 by way of example, comprises the following steps: (1) coating a glass substrate with a photosensitive resin containing a pigment uniformly dispersed therein, (2) exposing the thus-coated glass substrate to ultraviolet rays, (3) developing the thus-exposed coating to form a colored pattern, and (4) repeating the steps (1) to (3) until the other two colors are applied to the glass substrate. The color filter obtained by the pigment printing process has pattern accuracy as high as that obtained by the dyeing process and is also excellent in heat resistance and light resistance, but is accompanied by the following drawbacks:

(1) Its light transmission is inferior and its contrast is low, because light is scattered by the pigment particles.

(2) Prior to coating the photosensitive resin in which the pigment is uniformly dispersed, the resin should be passed through a filter to eliminate dust and large particles. Processing troubles therefore occur including clogging of the filter by coagulated pigment particles.

If the process shown in FIG. 2 is followed to fabricate a filter by using "M/P Pink REL" (trade name; product of Mitsui Toatsu Dyes, Ltd.) or "PS Green B" (trade name; product of Mitsui Toatsu Dyes, Ltd.), a resin-soluble conventional dye, instead of a pigment, the conventional dye is not immobilized in a matrix because its molecular weight is lower than 500. As a consequence, the dye may move to an adjacent matrix and cause color mixing. Further, the solubility of the conventional dye is insufficient so that the color filter must have a great film thickness in order to obtain a desired color density.

It is conceivable to immobilize a dye in a matrix resin using, as the dye, a reactive dye containing a monochlorotriazinyl group or a sulfatoethylsulfone group. Such reactive groups are however of the heat reactive type, thereby making it extremely difficult to fabricate micro-matrices like color filters. In addition, a salt remains in the resin after the reaction so that the electrical insulating property is impaired.

SUMMARY OF THE INVENTION

An object of the present invention is to provide a novel dye for a color filter, which is free of problems such as the above-mentioned filter clogging, requires no treatment for the prevention of mixing of individual colors and can furnish a color filter which has good transmission characteristics and is excellent in durability such as heat resistance, light resistance and moistureproofness.

Another object of the present invention is to provide a photosensitive resist resin composition containing the above-described novel dye for a color filter.

A further object of the present invention is to provide a color filter having good transmission characteristics and excellent durability such as heat resistance, light resistance and moistureproofness.

To attain the above objects, the present inventors have proceeded with an extensive investigation. As a result, it has been found that a dye meeting at least one of the below-described two requirements can be stably immobilized in a filter matrix and can hence provide a color filter free of dye color mixing and excellent in transmission characteristics and durability. These requirements are:

(1) Possession of a photopolymerizable substituent; and
(2) Molecular weight of at least 500 but not greater than 4000. Use of a dye capable of satisfying at least either one of these requirements makes it possible to stably immobilize the dye in a filter matrix.

The present invention therefore provides dyes represented by the below-described formula (1), $$D-(A-Y_{n^1})_{n^2} \tag{1}$$

wherein D represents a chromophoric nucleus, A denotes a connecting group, Y means the photopolymerizable group, $n^1$ is 1–10000, and $n^2$ stands for an integer of 1–10.

The present invention also provides dyes having a molecular weight of at least 500 but not greater than 4000 and represented by the below-described formula (8) or (9), $$D-(B-Z)_m \quad (8)$$

$$D-E-D \quad (9)$$

wherein D in each formula represents a chromophoric nucleus, and B and E each denotes a connecting group, Z is —COOR$^9$, CONR$^{10}$R$^{11}$, —OCOR$^{12}$, —OCOOR$^{13}$, —OCONHR$^{14}$, —NHR$^{15}$ or —NR$^{16}$R$^{17}$, R$^9$ and R$^{12}$ to R$^{17}$ independently representing a substituted or unsubstituted alkyl group, a substituted or unsubstituted cycloalkyl group, a substituted or unsubstituted aryl group or a substituted or unsubstituted aralkyl group and R$^{10}$ and R$^{11}$ independently representing a substituted or unsubstituted alkyl group, a substituted or unsubstituted cycloalkyl group, a substituted or unsubstituted aryl group, a substituted or unsubstituted aralkyl group or a hydrogen atom, and m stands for an integer of 1–10.

The present invention also provides photosensitive resist resin compositions comprising the aforesaid dyes, and LCD color filters fabricated by curing the photosensitive resist resin compositions.

The dyes according to the present invention are suitable as dyes for color filters for the following reasons:

(1) The dyes according to this invention are soluble in a resin. Especially, the dyes containing one or more ester, amido, acyl, carbamoyl, amino and/or like groups in their molecules have excellent compatibility with a resin so that they do not develop clogging or coating irregularities when they are coated upon fabrication of color filters having red, green and blue matrices with a photosensitive resist resin.

(2) The dyes according to this invention contain one or more photopolymerizable substituents. Upon photo-setting a resist resin composition, each dye and a photosensitive resist resin are copolymerized or polymerization takes place between molecules of each dye so that the dye is immobilized in the resin matrix. In the case of each dye having a high molecular weight of at least 500 but not greater than 4000, it does not migrate of a resin matrix once it enters the resin matrix and is incorporated therein. As a consequence, it is possible to avoid color mixing that may otherwise take place due to migration of the dye into an adjacent layer of a different color.

(3) As the dyes according to this invention are each immobilized in a matrix, the resulting color filter is free from discoloration which may otherwise take place as a result of sublimation of the dye, and is also excellent in durability such as heat resistance and moistureproofness.

DETAILED DESCRIPTION OF THE PREFERRED EMBODIMENTS

Figure 1:
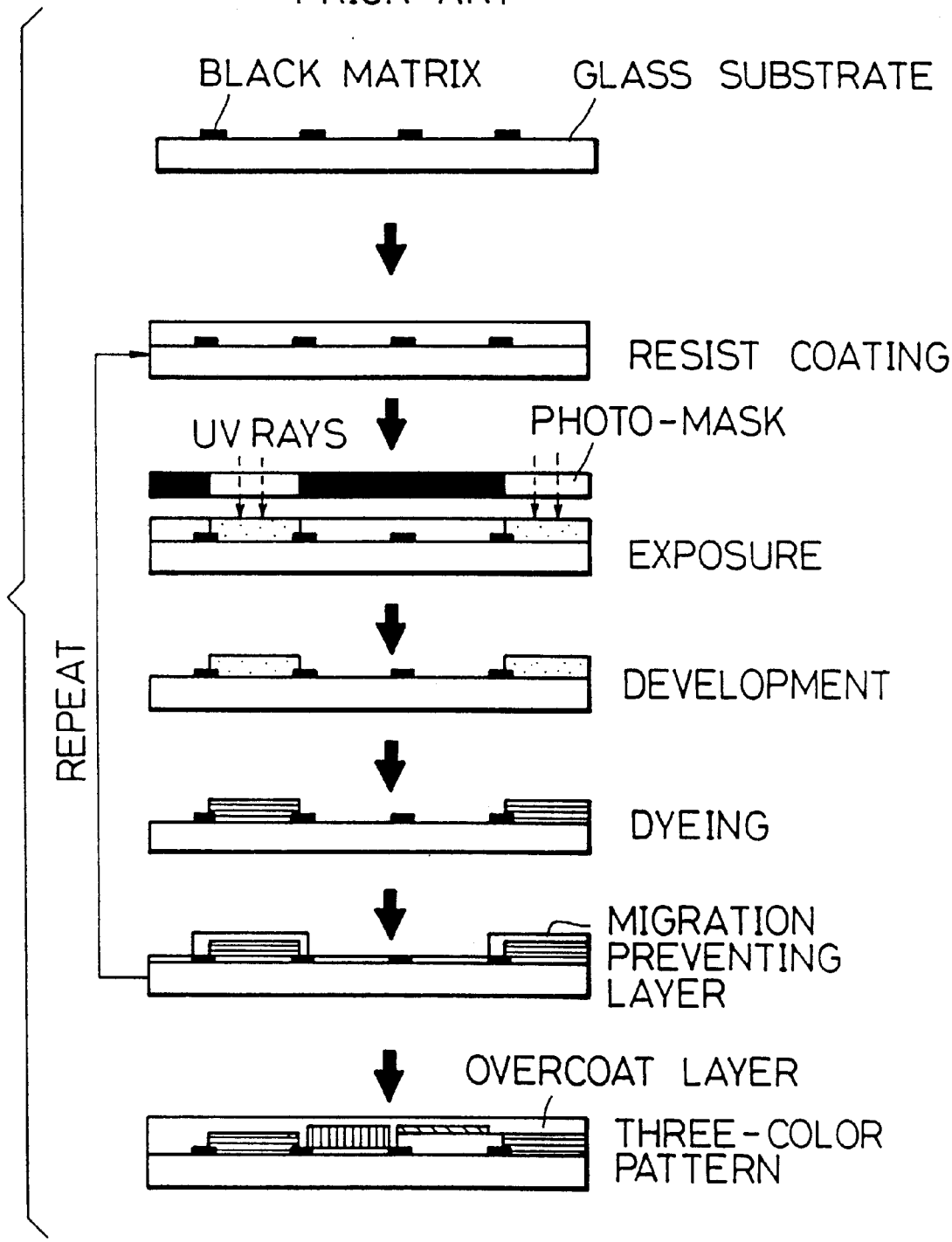
FIG. 1 is a schematic cross-section showing fabrication steps of a color filter according to a conventional dyeing process.
Figure 2:
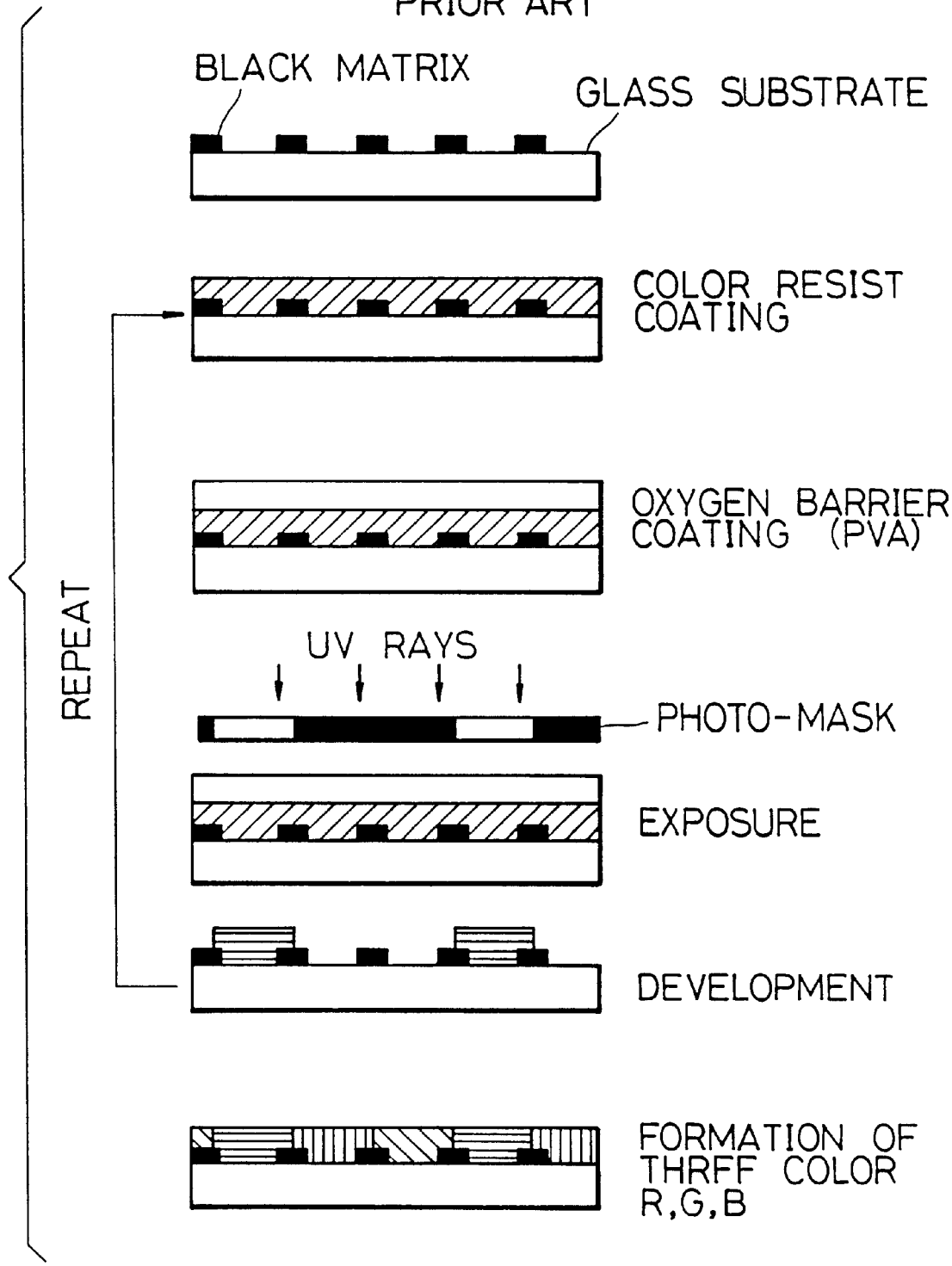
FIG. 2 is a schematic cross-section illustrating fabrication steps of a color filter according to a conventional pigment printing process.

The term "polymerizable substituents" as used herein means groups capable of inducing copolymerization between a resin and a dye or between dyes under light as well as photosensitive groups used in photosensitive resist resins disclosed in the literature (for example, "Photopolymer Handbook" compiled by Photo Polymer Association and published by Kogyo Chosakai, 1989). It includes those employed to bond dye molecules in a pendant-like form from resin molecules.

Preferred examples of dyes bonded thereon according to the present invention with photosensitive polymerizable substituents include those represented by the formula (1). In addition, it is preferred that the photosensitive group represented by Y in the formula (1) is selected from the group consisting of the following formulas (2)–(7):

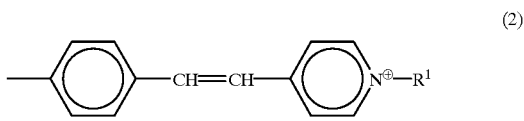

(2)

(3)

(4)

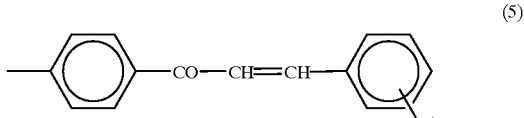

(5)

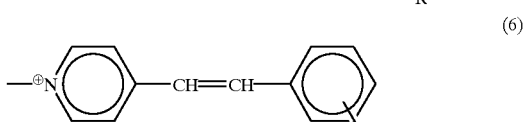

(6)

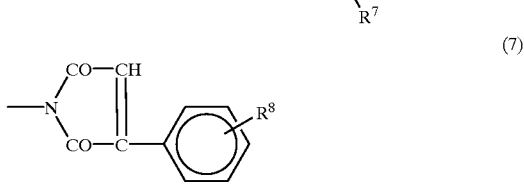

(7)

wherein R$^1$ to R$^4$ independently represent a substituted or unsubstituted alkyl group, a substituted or unsubstituted cycloalkyl group, a substituted or unsubstituted aralkyl group, or a hydrogen atom; R$^5$ represents a substituted or substituted alkyl group, a substituted or unsubstituted cycloalkyl group, a substituted or unsubstituted aryl group, or a substituted or unsubstituted aralkyl group, or a hydrogen atom; R$^{5'}$ is a hydrogen atom or a methyl group, provided that if R$^{5'}$ is a methyl group, then R$^5$ is a hydrogen atom; and R$^6$, R$^7$ and R$^8$ independently represent a substituted or unsubstituted alkyl group, a substituted or unsubstituted cycloalkyl group, a substituted or unsubstituted alkoxy group, a halogen atom, or a hydrogen atom.

It is preferred that if Y is formula (4), then D is the quinophthalone nucleus, the anthraquinone nucleus represented by any one of formulae (i) to (iii), (vii) and (vii) or a phthalocyanine nucleus represented by formula (ix)

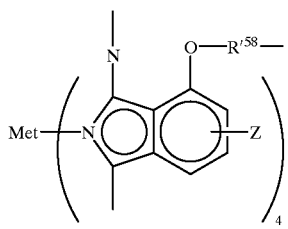

(ix)

wherein $R'^{58}$ is a substituted or unsubstituted alkyl group, a substituted or unsubstituted aryl group or a substituted or unsubstituted aralkyl group, Met is a divalent metal, a trivalent mono-substituted metal, a tetravalent di-substituted metal or a metal oxide, and Z is a hydrogen or halogen atom.

In the formulas (2) to (8), examples of the unsubstituted alkyl group include linear and branched alkyl groups such as methyl, ethyl, n-propyl, isopropyl, n-butyl, iso-butyl, sec-butyl, t-butyl, n-pentyl, iso-pentyl, neo-pentyl, 1,2-dimethylpropyl, n-hexyl, n-dodecyl, 2-methylbutyl, 2-methylpentyl, 1,3-dimethylbutyl, 1-iso-propylpropyl, 1,2-dimethylbutyl, n-heptyl, 1,4-dimethylpentyl, 2-methyl-1-iso-propylpropyl, 1-ethyl-3-methylbutyl, n-octyl, 2-ethylhexyl, 2-methyl-1-iso-propylbutyl, 2,2-dimethyl-1-iso-propyl-1-t-butylpropyl, and n-nonyl. Exemplary substituted alkyl groups include alkoxyalkyl groups such as methoxymethyl, methoxyethyl, ethoxyethyl, propoxyethyl, butoxyethyl, γ-methoxypropyl, γ-ethoxypropyl, methoxyethoxyethyl, ethoxyethoxyethyl, dimethoxymethyl, diethoxymethyl, dimethoxyethyl, and diethoxyethyl; halogenated alkyl groups such as chloromethyl, 2,2,2-trichloroethyl, trifluoromethyl, and 1,1,1,3,3,3-hexafluro-2-propyl; and hydroxyalkyl groups such as hydroxymethyl, hydroxyethyl, hydroxypropyl, hydroxybutyl, hydroxypentyl, and hydroxyoctyl.

Examples of the unsubstituted cycloalkyl group include cyclopentyl and cyclohexyl. Exemplary substituted cycloalkyl groups include cyclopentyl and cyclohexyl groups substituted by one or more groups, for example, alkyl groups such as methyl, ethyl and propyl, alkoxy groups such as methoxy, ethoxy and butoxy, halogen atoms such as chlorine, bromine, fluorine and iodine, cyano groups, nitro groups and/or hydroxyl groups.

Examples of the unsubstituted alkoxyl group include methoxyl, ethoxyl, n-propoxyl, iso-propoxyl, n-butoxyl, iso-butoxyl, sec-butoxyl, t-butoxyl, n-pentoxyl, iso-pentoxyl, neo-pentoxyl, 1,2-dimethylpropoxyl, n-hexyloxyl, cyclohexyloxyl, 1,3-dimethylbutoxyl, 1-iso-propylpropoxyl, 1,2-dimethylbutoxyl, n-heptyloxyl, 1,4-dimethylpentyloxyl, 2-methyl-1-iso-propylpropoxyl, 1-ethyl-3-methylbutoxyl, n-octyloxyl, 2-ethylhexyloxyl, 3-methyl-1-iso-propylbutoxyl, 2-methyl-1-iso-propylbutoxyl, 1-t-butyl-2-methylpropoxyl, n-nonyloxyl and n-decyloxyl. Exemplary substituted alkoxyl groups include alkoxyalkoxyl groups such as methoxymethoxyl, methoxyethoxyl, ethoxyethoxyl, propoxyethoxyl, butoxyethoxyl, γ-methoxypropoxyl, γ-ethoxypropoxyl, methoxyethoxyethoxyl, ethoxyethoxy-ethoxyl, dimethoxymethoxyl, diethoxymethoxyl, dimethoxyethoxyl, and diethoxyethoxyl; halogenated alkoxyl groups such as chloromethoxyl, 2,2,2-trichloroethoxyl, trifluoromethoxyl, and 1,1,1,3,3,3-hexafluoro-2-propoxyl; and hydroxyalkoxyl groups such as hydroxymethoxyl, hydroxyethoxyl, hydroxypropoxyl, hydroxybutoxyl, hydroxypentyloxyl, and hydroxyoctyloxyl.

Illustrative of the unsubstituted aryl group include phenyl, napthyl and indenyl.

Examples of the substituted aryl group include phenyl, naphthyl and indenyl groups containing one or more substituents, for example, linear and branched alkyl groups such as methyl, ethyl, propyl, iso-propyl, butyl, 2-methylpropyl, pentyl and/or neo-pentyl, alkoxyl groups such as methoxyl, ethoxyl and/or propoxyl and/or halogen atoms such as chlorine, fluorine, bromine and/or iodine.

Examples of the unsubstituted aralkyl group include benzyl and phenethyl.

Illustrative of the substituted aralkyl group include benzyl and phenetyl groups containing one or more substituents, for example, linear and branched alkyl groups such as methyl, ethyl, propyl, iso-propyl, butyl, 2-methylpropyl, pentyl and/or neo-pentyl, alkoxyl groups such as methoxyl, ethoxyl and/or propoxyl, and/or halogen atoms such as chlorine, fluorine, bromine and/or iodine.

Exemplary halogen atoms include chlorine, bromine, iodine and fluorine.

In the formulas (1), (8) and (9), any known skeletons disclosed in literature can be used as the chromophoric nucleus represented by D, including azo, anthraquinone, phthalocyanine, quinophthalone, styrylic, indoaniline and cyanine skeletons (see, for example, "Color Handbook", compiled by Ohkawara et al., Kodansha Ltd. (1986), "The Chemistry of Synthetic Dyes", Vols. I–VI, edited by K. Venkataraman et al. and published by Academic Press, and "Synthetic Dye Overview" written by Hiroshi Horiguchi, Sankyo Publishing Co.". The skeletons will hereinafter be described specifically. They can contain one or more substituents thereon. Each connecting group in the formulas (1), (8) and (9) can bond to a substituent which has been bonded to a chromophoric nucleus.

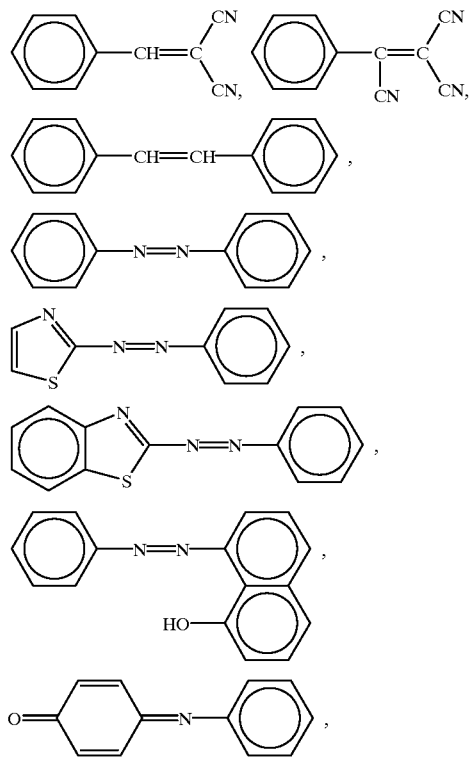

-continued
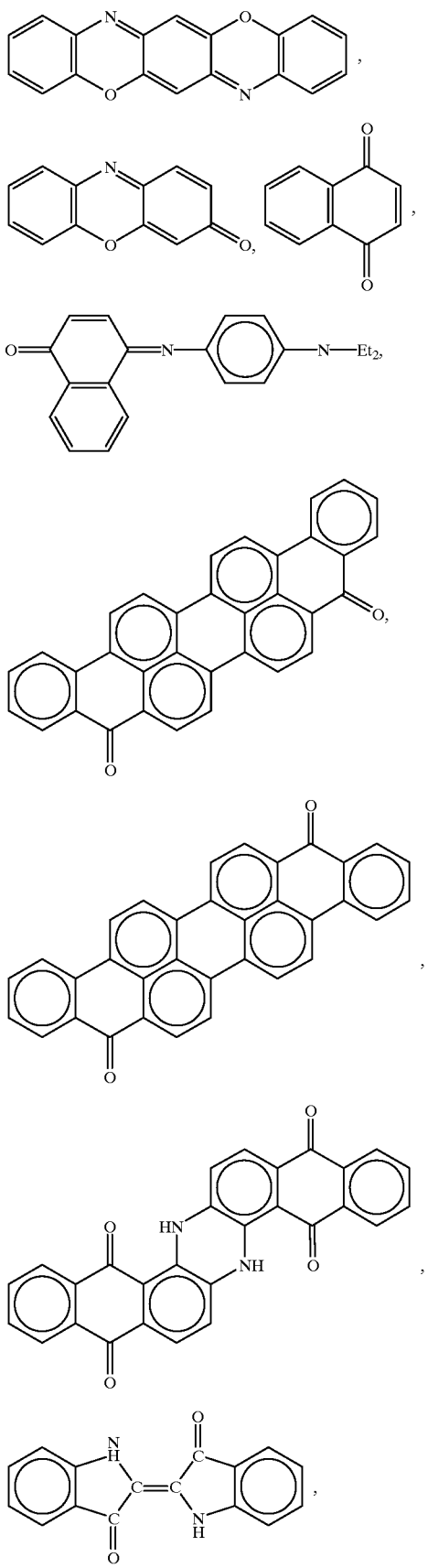
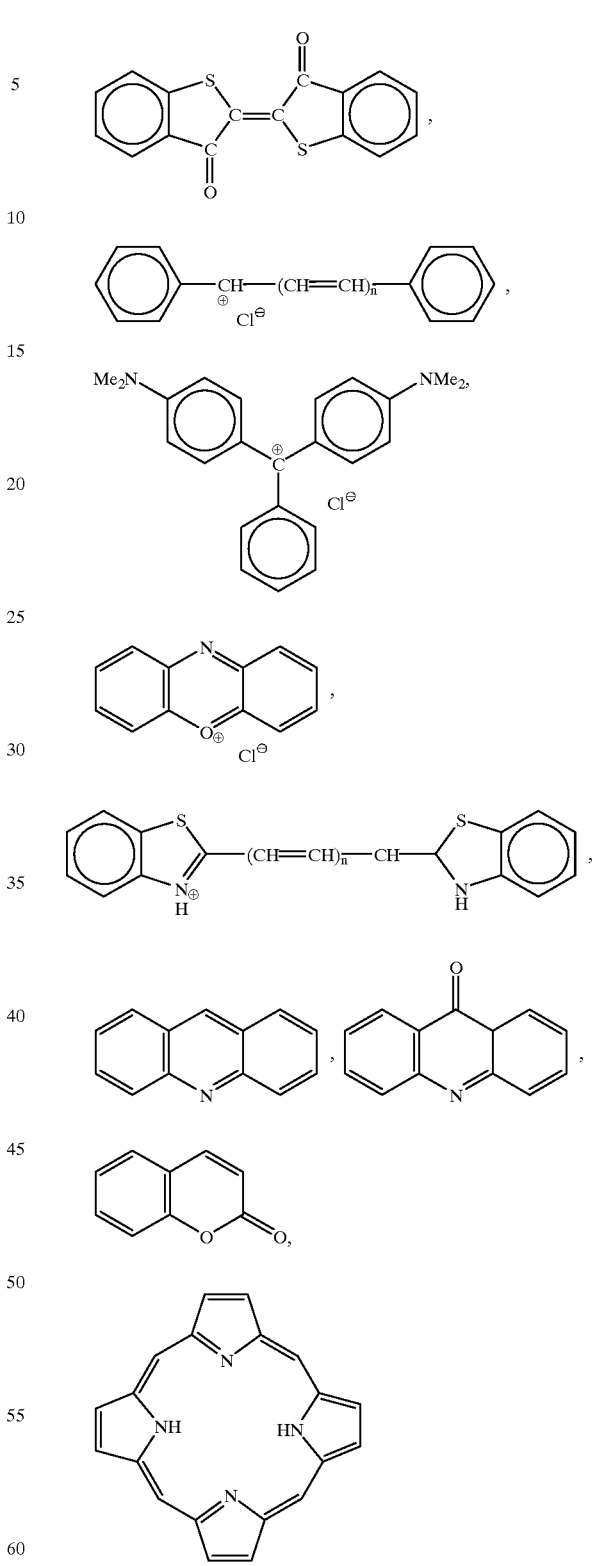
Particularly preferred, illustrative chromophoric. nuclei include, from the viewpoint of durability, dye skeletons represented by the following formulas (16) to (18):

(16)

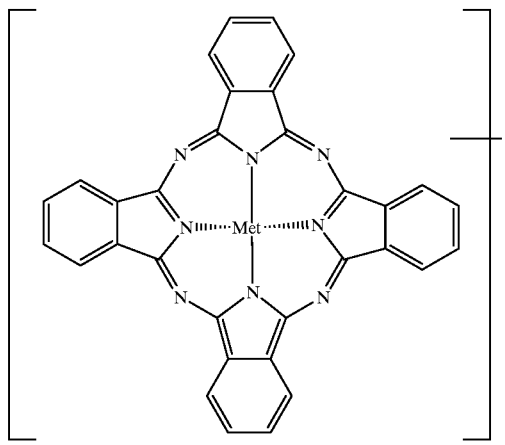

$(Y^1)_l$ wherein $Y^1$ represents 1–15 same or different substituents selected from hydrogen atoms, substituted and unsubstituted alkyl groups, substituted and unsubstituted cycloalkyl groups, substituted and unsubstituted aryl groups, substituted or unsubstituted alkoxyl groups, substituted and unsubstituted aryloxyl groups, substituted and unsubstituted alkylthio groups, substituted and unsubstituted arylthio groups, substituted and unsubstituted alkylamino groups, substituted and unsubstituted dialkylamino groups, substituted and unsubstituted arylamino groups, substituted and unsubstituted diarylamino groups, amino groups, halogen atoms, nitro group, nitrile group, substituted and unsubstituted acyl groups, substituted and unsubstituted alkoxycarbonyl groups, and substituted and unsubstituted amido groups; Met is a divalent metal, a trivalent mono-substituted metal, a tetravalent di-substituted metal, or a metal oxide; and l stands for an integer from 1–15;

(17)

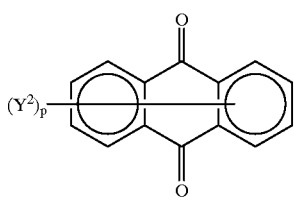

$(Y^2)_p$ wherein $Y^2$ represents 1–7 same or different substituents selected from hydrogen atoms, substituted and unsubstituted alkyl groups, substituted and unsubstituted cycloalkyl groups, substituted and unsubstituted aryl groups, substituted and unsubstituted alkoxyl groups, substituted and unsubstituted aryloxyl groups, substituted and unsubstituted alkylthio groups, substituted and unsubstituted arylthio groups, substituted and unsubstituted alkylamino groups, substituted and unsubstituted dialkylamino groups, substituted and unsubstituted arylamino groups, substituted and unsubstituted diarylamino groups, hydroxy group, amino groups, halogen atoms, nitro group, nitrile group, substituted or unsubstituted acyl groups, substituted and unsubstituted alkoxycarbonyl groups, substituted or unsubstituted 2,3-dicarboxyimide groups, and substituted and unsubstituted amido groups; and p stands for an integer of from 1–7;

(18)

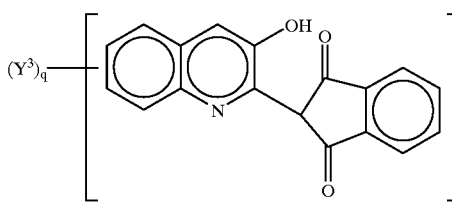

$(Y^3)_q$ wherein $Y^3$ represents 1–8 same or different substituents selected from hydrogen atoms, substituted and unsubstituted alkyl groups, substituted and unsubstituted cycloalkyl groups, substituted and unsubstituted aryl groups, substituted and unsubstituted alkoxyl groups, substituted and unsubstituted aryloxyl groups, substituted and unsubstituted alkylthio groups, substituted and unsubstituted arylthio groups, substituted and unsubstituted alkylamino groups, substituted and unsubstituted dialkylamino groups, substituted and unsubstituted arylamino, substituted and unsubstituted diarylamino groups, amino groups, halogen atoms, nitro group, nitrile group, substituted and unsubstituted acyl groups, substituted and unsubstituted alkoxycarbonyl groups, and substituted and unsubstituted amido groups; and q stands for an integer of from 1–8.

Also preferred for the group D of formulae (1), (8) and (9) are groups of the formula (i), (ii), (iii), (vii) and (viii) described as follows:

(i)

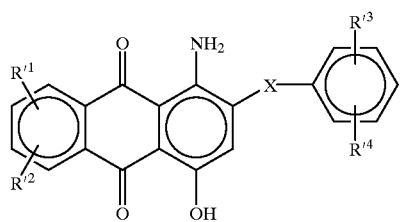

wherein X is an oxygen or sulfur atom, $R'^1$ to $R'^4$ each are independently a hydrogen atom, a substituted or unsubstituted alkyl group, a substituted or unsubstituted alkoxy group or a halogen atom;

(ii)

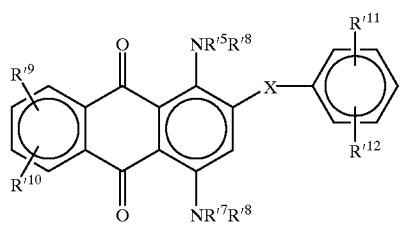

wherein X is an oxygen or sulfur atom, $R'^5$ to $R'^8$ each are independently a substituted or unsubstituted alkyl group, a substituted or unsubstituted cycloalkyl group, a substituted or unsubstituted aryl group or a hydrogen atom, $R'^9$ to $R'^{12}$ each are independently a hydrogen atom, substituted or unsubstituted alkyl group, a substituted or unsubstituted alkoxy group or a halogen atom;

(iii)

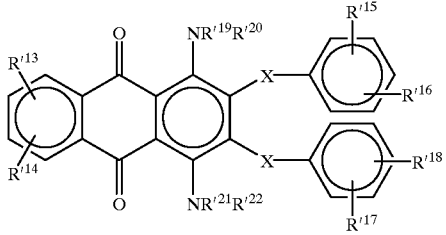

wherein X is an oxygen or sulfur atom, $R'^{13}$ to $R'^{18}$ each are independently a hydrogen atom, a substituted or unsubstituted alkyl group, a substituted or unsubstituted alkoxy group or a halogen atom, $R'^{19}$ to $R'^{22}$ each are independently a substituted or unsubstituted cycloalkyl group, a substituted or unsubstituted aryl group or a hydrogen atom;

(vii)

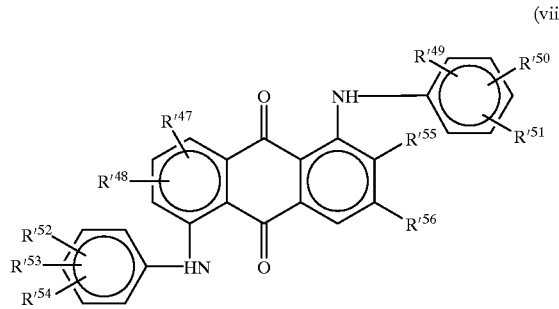

wherein $R'^{47}$ to $R'^{54}$ each are independently a hydrogen atom, a substituted or unsubstituted alkyl group, substituted or unsubstituted alkoxy group, a substituted or unsubstituted cycloalkyl group or a halogen atom, $R'^{55}$ and $R'^{56}$ each are independently a substituted or unsubstituted alkyl group, a substituted or unsubstituted alkoxy group, a cyano group, a halogen atom or a hydrogen atom;

(viii)

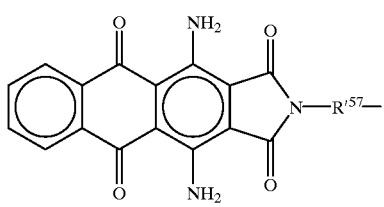

wherein $R'^{57}$ is a substituted or unsubstituted alkyl group or a substituted or unsubstituted aryl group.

In formula (1), the connecting group represented by A can be any connecting group which can covalently bond a chromophoric nucleus or its substituent to photopolymerizable group Y. Alternatively, it is possible to directly bond a chromophoric nucleus or its substituent to photopolymerizable group Y without the connecting group A. Examples of the connecting group A include those represented by the following formulas (19) to (22), in which parenthesized recurring units may be combined together at random:

(19)

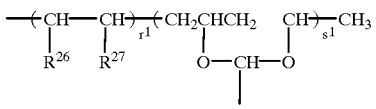

wherein one of $R^{26}$ and $R^{27}$ represents a hydrogen atom and the other denotes a hydroxyl group; and $r^1$ and $s^1$ each stands for an integer of from 1–10000;

(20)

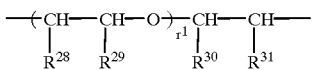

wherein $R^{28}$ to $R^{31}$ independently represent a hydrogen atom, a substituted or unsubstituted alkyl group, a substituted or unsubstituted cycloalkyl group, a substituted or unsubstituted aryl group, or a halogen atom; and $r^2$ stands for an integer of from 1–10000;

(21)

wherein $r^3$ stands for an integer of 1–10000.

(22)

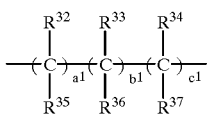

wherein $R^{32}$ to $R^{37}$ independently represent a hydrogen atom, a halogen atom, a hydroxyl group, —SH, an amino group, a substituted or unsubstituted alkyl group, a substituted or unsubstituted cycloalkyl group, a substituted or unsubstituted aryl group, a substituted or unsubstituted alkoxyl group, a substituted or unsubstituted aryloxyl group, a substituted or unsubstituted alkylamino group, or a substituted or unsubstituted arylamino group; and $a^1$, $b^1$ and $c^1$ each stands for an integer of from 0–10000.

The connecting group represented by B in the formula (8) can be any divalent connecting group. Alternatively, it is possible to directly bond a chromophoric nucleus to a substituent without the connecting group B. Its examples include the groups represented by formulas (20) to (22) in which $r^1$ to $r^3$, $s^1$, $a^1$, $b^1$ and $c^1$ each stands for an integer of from 1–100. The connecting group represented by E in the formula (9) can be any divalent connecting group. Its examples include —F—OCO—G—COO—F—, —F—COO—G—OOC—F—, —F—CONH—G—NHCO—F—, —F—OCONH—G—NHCOO—F— and —F—OCOO—G—OCOO—F—. F and G can be any divalent connecting groups. Their examples include the groups represented by the formulas (20) to (23) in which $r^1$ to $r^3$, $s^1$, $a^1$, $b^1$ and $c^1$ each stands for an integer of from 1–100, and parenthesized recurring units may be combined together at random.

Formula (23) connecting groups are those of the formula

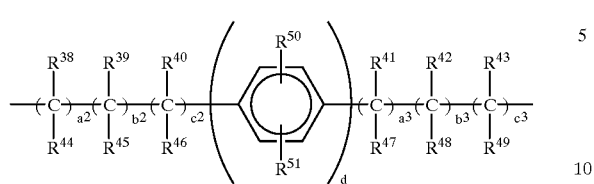
(23)

wherein $R^{38}$ to $R^{49}$ independently represent a hydrogen atom, a substituted or unsubstituted alkyl group, a substituted or unsubstituted cycloalkyl group, a substituted or unsubstituted aryl group, or a halogen atom; $R^{50}$ and $R^{51}$ independently represent a hydrogen atom, a substituted or unsubstituted alkyl group, a substituted or unsubstituted cycloalkyl group, a substituted or unsubstituted aryl group, a substituted or unsubstituted alkoxyl group, or a halogen atom; $a^2$, $b^2$, $c^2$, $a^3$, $b^3$ and $c^3$ each stands for an integer of from 0–100; and d stands for an integer of 1–5.

Each photosensitive resist resin composition according to the present invention comprises at least one of the dyes of the present invention and a resist resin containing photosensitive groups therein. It may further contain a photopolymerization initiator, a diluent, and one or more other additives.

The dyes represented by the formula (1) or (8) can each be synthesized by one of the following processes:

(1) a process in which the connecting group is bonded to the chromophoric nucleus D, followed by bonding of Y or Z;

(2) a process in which the connecting group is bonded to Y or Z, followed by bonding to the chromophoric nucleus D;

(3) a process in which a chromophoric nucleus intermediate is reacted to the connecting group or with a connecting group containing Y or Z, followed by the construction of the corresponding chromophoric nucleus. One of these processes can be selected suitably depending on the combination of the chromophoric nucleus D, the connecting group and the group Y or Z;

The dyes represented by the formula (9) can each be synthesized by one of the following processes:

(1) a process in which the chromophoric nucleus D is reacted with the connecting group E, which contains a bifunctional group, in an amount of 0.5 equivalent or less to conduct dimerization;

(2) a process in which the connecting group E is bonded to the chromophoric nucleus D, followed by the bonding of the chromophoric nucleus D. One of these processes can be selected suitably depending on the combination of the chromophoric nucleus D and the connecting group E.

In the process of the present invention for the fabrication of a color filter, any photosensitive resist resin can be used in combination with the dye of the present invention as long as the resin is curable by light. Namely, any resin containing one or more photosensitive groups and which is known in the literature can be used (see "Recording Materials and Photosensitive Resins", published by the Publication Center of the Japan Society for the Promotion of Science; and "Photopolymer Handbook", compiled by Photopolymer Association and published by Kogyo Chosakai, 1989). Preferred are resist resins containing photosensitive groups selected from the group consisting of the following formulas (10) to (15):

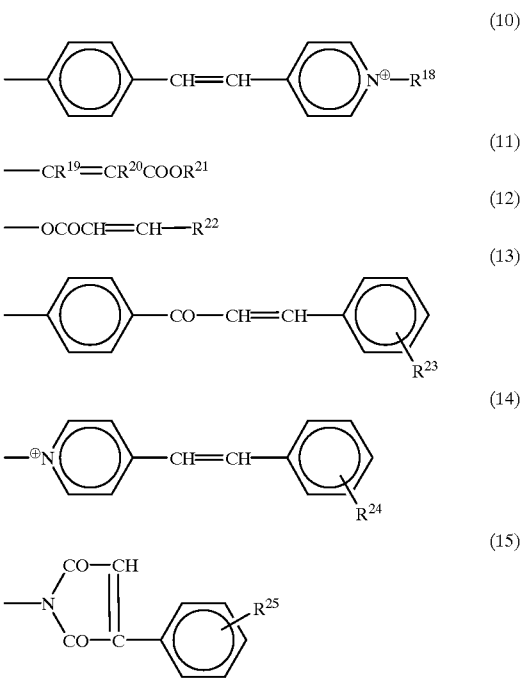

wherein $R^{18}$ to $R^{21}$ independently represent a substituted or unsubstituted alkyl group, a substituted or unsubstituted cycloalkyl group, a substituted or unsubstituted aralkyl group, or a hydrogen atom; $R^{22}$ represents a substituted or unsubstituted alkyl group, a substituted or unsubstituted cycloalkyl group, a substituted or unsubstituted aryl group, a substituted or unsubstituted aralkyl group, or a hydrogen atom; and $R^{23}$ to $R^{25}$ independently represent a substituted or unsubstituted alkyl group, a substituted or unsubstituted cycloalkyl group, a substituted or unsubstituted alkoxyl group, a hydrogen atom, or a halogen atom.

The color filter of the present invention can be fabricated, as one example, by dissolving beforehand the dye of the present invention (red, green or blue) in a photosensitive resin composition, forming the resulting formulation into a film on a substrate by casting, spin coating or the like and then patterning the film by exposure to light. Alternatively, at least two kinds of dyes of the present invention can be mixed to obtain a red, green or blue color.

With reference to the accompanying drawings, a typical filter fabrication process will hereinafter be described taking the fabrication of a stripe filter as one example.

Figure 3:
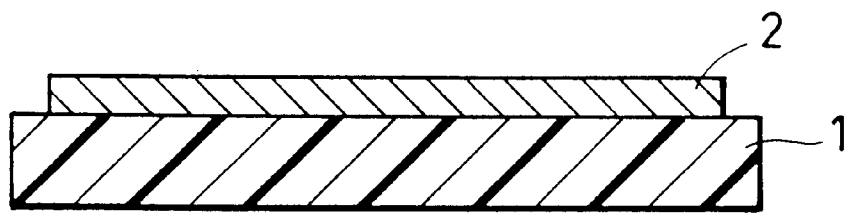
FIGS. 3 through 6 are cross-sections depicting fabrication steps of a color filter according to the present invention.

First, one of the dyes (red, green or blue) according to this invention is dissolved in a solvent containing photosensitive resin at a proportion of 1–100 parts by weight, preferably 40–100 parts by weight in 100 parts by weight of a photosensitive resin, and the resulting formulation is spin-coated on a substrate 1 by using a spinner (FIG. 3). The thickness of a resist layer 2 is usually 0.5–100 μm although it is determined depending on spectroscopic characteristics desired. After the resist layer 2 is dried, the resist layer 2 is pre-baked under suitable temperature conditions. The resist layer is exposed to light or an electron beam, to which the resist has sensitivity, through a mask 3 having a desired pattern corresponding to a pattern to be formed (e.g., a stripe pattern)—FIG. 4. The resist layer so exposed is then developed to form a pattern 4 (FIG. 5). Finally, post-baking is applied under appropriate temperature conditions.

Figure 4:
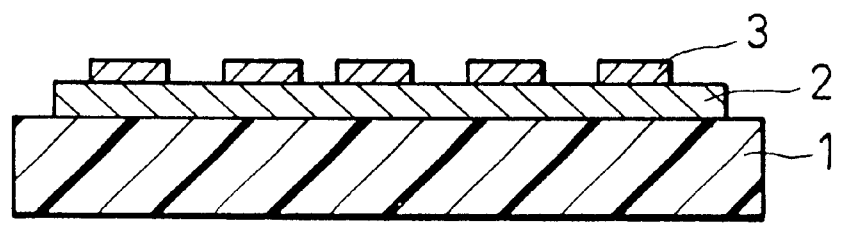
Figure 5:
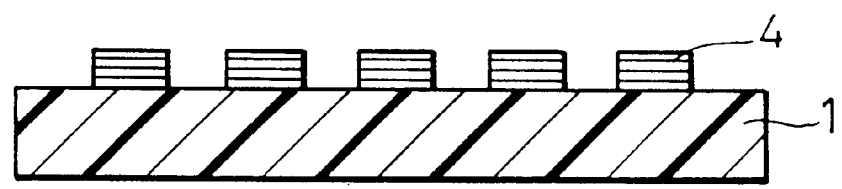
Figure 6:
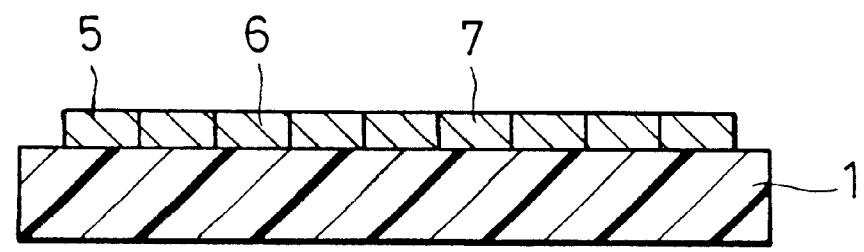

To form a color filter having two or more colors, the steps of from FIG. 3 to FIG. 5 are repeated using dyes corresponding to the respective colors as needed, namely, as many times as the number of filter colors employed, thereby making it possible to form, for example, a color filter having three colored layers 5,6,7 of different colors as shown in FIG. 6. Where a black matrix is formed, it is desired to form it before the formation of colored layers.

As has been described above, patterning of each dye layer can be conducted on an optically transparent substrate. No particular limitation is imposed on the substrate to be used, insofar as it permits patterning of the dye layer and the color filter so formed functions as desired.

Examples of the substrate include a glass plate; and films or plates of resins such as polyvinyl alcohol, hydroxyethylcellulose, polymethyl methacrylate, polyesters, polybutyral, polyamides, polyethylene, polyvinyl chloride, polyvinylidene chloride, polycarbonates, polyolefin copolymers, vinyl chloride copolymers, vinylidene chloride copolymers and styrene copolymers. A patterned dye layer can be formed integrally with a substrate which is applied as a color filter.

The present invention will hereinafter be described in detail by the following examples. It should however be borne in mind that this invention should not be limited to or by the following examples.

EXAMPLE 1

A mixture of ten parts of 1-amino-4-hydroxy-2-chloroanthraquinone, 5 parts of polyvinyl alcohol having an average molecular weight of 750, 5 parts of potassium carbonate and 100 parts of dimethylformamide was heated to 120° C. and then, reacted for 10 hours. The reaction mixture was poured into 500 parts of 5% hydrochloric acid solution, followed by extraction with 100 parts of chloroform. The extract was purified by column chromatography (eluent: chloroform-methanol). The purified product (8 parts) and the compound represented by the following formula (24):

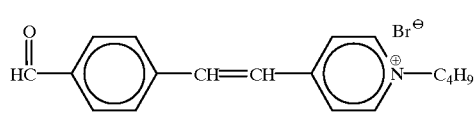

(24)

were then reacted. The reaction product was purified by column chromatography, whereby 7 parts of the compound represented by the following formula (25):

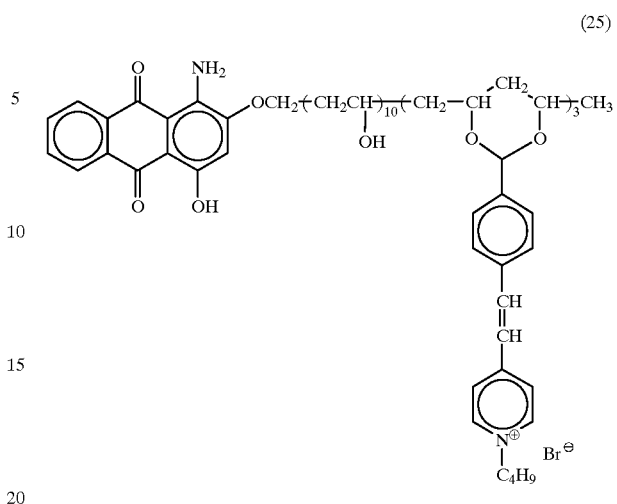

(25)

$\lambda$ max = 510 nm
IR: 1670 cm$^{-1}$(CH═CH stretching)

and its isomer were obtained.

EXAMPLE 2

A mixture of 14 parts of 3-nitrophthalonitrile, 10 parts of polyvinyl alcohol having an average molecular weight of 750, 5 parts of sodium hydride and 200 parts of dimethylformamide was heated to 120° C. and then, reacted for 10 hours. The reaction mixture was extracted with 500 parts of chloroform. The extract was purified by column chromatography (eluent: chloroform-methanol). The purified product (5 parts), 1 part of cuprous chloride, 4 parts of diazabicycloundecene and 100 parts of n-amyl alcohol were mixed, followed by reaction for 6 hours under reflux. The reaction mixture was concentrated under reduced pressure to distill off the amyl alcohol. The residue was purified by column chromatography. The purified product (7 parts) and the compound represented by the formula (24) were then reacted. The reaction product was purified by column chromatography, whereby 7 parts of the compound represented by the following formula (26):

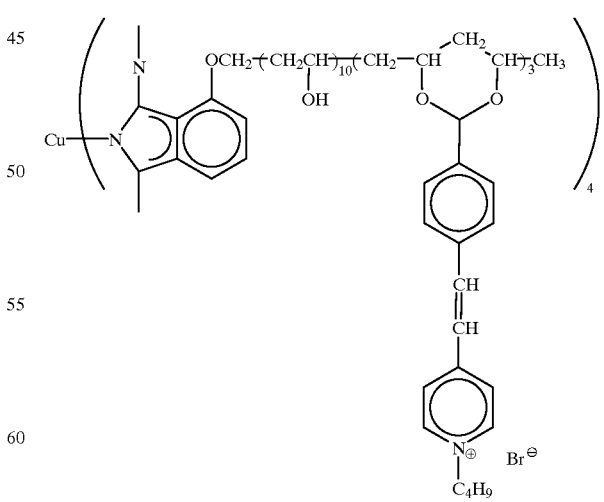

(26)

$\lambda$ max = 699nm
IR: 1670cm$^{-1}$(CH═CH stretching)

and its isomer were obtained.

EXAMPLE 3

A mixture of ten parts of 1,4-diamino-2,3-dichloroanthraquinone, 5 parts of polyvinyl alcohol having an average molecular weight of 750, 5 parts of potassium carbonate and 50 parts of dimethylformamide was heated to 120° C. and then, reacted for 10 hours. The reaction mixture was poured into 500 parts of 5% hydrochloric acid solution, followed by extraction with 300 parts of chloroform. The extract was purified by column chromatography (eluent: chloroform-methanol). The purified product (5 parts) and the compound represented by the formula (24) were then reacted. The reaction product was purified by column chromatography, whereby 5 parts of the compound represented by the following formula (27):

(27)

$R=$ —$CH_2$—$(CH_2CH)_{10}$—$CH_2$—$CH$—$CH_2$—$CH$—$)_3$$CH_3$
          |                                      |
         OH                                    O   O
                                                \ /
                                                 CH $\lambda$ max = 555 nm
IR: 1670 cm$^{-1}$(CH═CH stretching)

and its isomer were obtained.

EXAMPLE 4

The dye (3.2 parts) of the formula (25) and 80 parts of a 20% solution of a stilbazole photosensitive resin in polyvinyl alcohol were mixed. A color filter substrate with black stripes of 20 μm wide was spin-coated to a thickness of 3 μm with the resulting mixture. After being photomasked, the substrate was exposed to ultraviolet rays under a halogen lamp. The uncured parts were washed off, whereby a red filter layer was formed. In a similar manner, a green and blue filter layers were formed on the same substrate using dyes represented by the formulas (26) and (27), respectively.

The thus-obtained filter for a color LCD was free of color mixing between the individual colors and hence had vivid color tones. In addition, no quality deterioration was observed although it was heated to 250° C. during formation of ITO electrodes. The filter did not undergo deterioration either in a weathering test by a weatherometer or in a light-resistance test under carbon arc lamps.

Comparative Example 1

In a similar manner to Example 4, a color filter was fabricated using "M/P Pink REL" and "PS Green B" (each, trade name; product of Mitsui Toatsu Dyes, Ltd.) and "Macrolex Blue 2R" (trade name; product of Bayer A.G.). In Table 1, characteristics of the color filter are presented in comparison with those of the color filter fabricated in Example 4.

The following methods and standards were followed for the measurements of the respective characteristics and for the evaluation of the measurement results.

1. Transmittance Characteristics

A: Maximum transmittance$\geq$80%, with the proviso that the transmittance is 10% or lower at (the wavelength for the maximum transmittance±50 nm).

C: Maximum transmittance$\leq$70%, with the proviso that the transmittance is 10% or lower at (the wavelength for the maximum transmittance±50) nm.

B: Other than A or C

2. Moistureproofness

Color difference was determined after each filter was stored at 95% R.H. and 60° C. for 200 hours.

A: $\Delta E \leq 3$
B: $3<\Delta E<5$
C: $\Delta E \geq 5$

3. Light Resistance

Color difference was determined after each filter was exposed to light with a fadeometer at 60° C. for 200 hours.

A: $\Delta E \leq 3$
B: $3<\Delta E<5$
C: $\Delta E \geq 5$

4. Heat Resistance

Color difference was determined after each filter was stored at 250° C. for 1 hour.

A: $\Delta E \leq 3$
B: $3<\Delta E<5$
C: $\Delta E \geq 5$

TABLE 1

| | Example 4 | Comp.Ex. 1 |
|---|---|---|
| Migration of dye | Not observed | Observed |
| Transmittance characteristics | | |
| Red | A | B |
| Green | A | B |
| Blue | A | C |
| Moistureproofness | | |
| Red | A | C |
| Green | A | B |
| Blue | A | C |
| Light resistance | | |
| Red | A | B |
| Green | A | B |
| Blue | A | C |
| Heat resistance | | |
| Red | A | C |
| Green | A | B |
| Blue | A | C |

EXAMPLE 5

Dissolved in 30 parts of glacial acetic acid were 10 parts of 1-amino-2-p-acetylphenoxy-4-hydroxyanthraquinone and 3.5 parts of benzaldehyde. Sulfuric acid (2 parts) was added to the resulting solution, followed by reaction at 40–45° C. for 12 hours. The reaction mixture was poured into 530 ml of water. The resulting precipitate was collected by filtration, followed by drying. The residue was purified by column chromatography, whereby 7 parts of the compound represented by the following formula (28) were obtained.

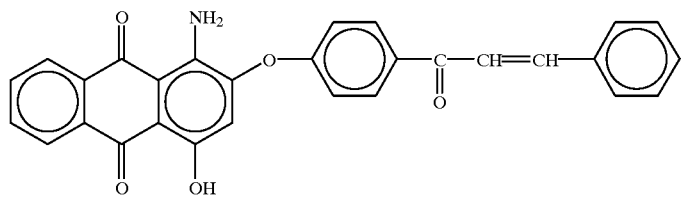

(28)

λ max = 510 nm
ε g= 2.8 X 10⁴ ml/g•cm (solvent: toluene)

Elemental analysis for: $C_{29}H_{19}NO_5$ (29)

TABLE 2

| | C | H | N |
|---|---|---|---|
| Calculated (%) | 75.49 | 4.12 | 3.04 |
| Found (%) | 75.48 | 4.13 | 3.06 |

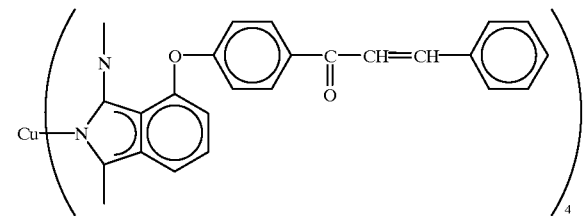

λ max = 698 nm
ε g= 1.8 X 10⁴ ml/g•cm (solvent: toluene)

and its isomer were obtained.
Elemental analysis for $C_{92}H_{56}N_8O_8Cu$

EXAMPLE 6

Ten parts of 3-nitrophthalonitrile, 9.4 parts of p-hydroxyacetophenone and 2.2 parts of 60% sodium hydride were added to 150 parts of dimethylformamide and heated to 120° C., followed by reaction for 10 hours. The reaction mixture was poured into 1000 parts of 5% hydrochloric acid solution, followed by extraction with 400 parts of chloroform. The resulting extract was purified by column chromatography (eluent: chloroform-methanol). The compound so purified (5 parts), 0.5 part of cuprous chloride, 2.7 parts of diazabicyclo-undecene and 50 parts of n-amyl alcohol were mixed, followed by reaction for 5 hours under reflux. Amyl alcohol was distilled off under reduced pressure from the reaction mixture, followed by purification by column chromatography. Three parts of the purified product and 0.4 part of benzaldehyde were reacted at 40–45° C. for 10 hours in 50 parts of glacial acetic acid in the presence of sulfuric acid. The reaction mixture was poured into 500 parts of water. The resulting mixture was filtered, dried and then purified by column chromatography, whereby 2 parts of the compound represented by the following formula (29):

TABLE 3

| | C | H | N |
|---|---|---|---|
| Calculated (%) | 75.43 | 3.83 | 7.65 |
| Found (%) | 75.42 | 3.85 | 7.63 |

EXAMPLE 7

A mixture of ten parts of 1,4-diamino-2-chloroantraquinone, 7.5 parts of p-mercaptoacetophenone, 1.2 parts of potassium carbonate and 50 parts of dimethylformamide was heated to 120° C., followed by reaction for 10 hours. The reaction mixture was poured into 500 parts of 5% hydrochloric acid solution, followed by extraction with 300 parts of chloroform. The extract was purified by column chromatography (eluent: chloroform-methanol). Eight parts of the purified product and 2.8 parts of benzaldehyde were reacted at 40–45° C. for 9 hours in 60 parts of glacial acetic acid in the presence of sulfuric acid. The reaction mixture was poured into 500 parts of water. The resulting precipitate was filtered, dried and then purified by column chromatography, whereby 6 parts of the compound represented by the following formula (30):

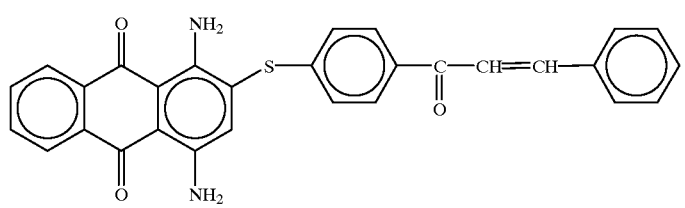

(30)

λ max = 559 nm
ε g= 3.4 X 10⁴ ml/g•cm (solvent: toluene)

Elemental analysis for $C_{29}H_{20}N_2O_3S$

TABLE 4

|  | C | H | N |
|---|---|---|---|
| Calculated (%) | 73.11 | 4.20 | 5.88 |
| Found (%) | 73.12 | 4.22 | 5.87 |

EXAMPLE 8

The dye (3.2 parts) of formula (28) and 80 parts of a 20% solution of the photosensitive resin disclosed in Japanese Patent Publication No. 15026/1975 were mixed. A color filter substrate with black stripes of 20 μm wide was spin-coated to a thickness of 3 μm with the resulting mixture. After being photomasked, the substrate was exposed to ultraviolet rays under a halogen lamp. The uncured parts were washed off, whereby a red filter layer was formed. In a similar manner, a green and blue filter layers were formed using dyes represented by formula (29) and (30), respectively.

The thus-obtained filter for a color LCD was free of color mixing between the individual colors and hence had vivid color tones. In addition, no quality deterioration was observed although it was heated to 250° C. during formation of ITO electrodes. The filter did not undergo deterioration either in a weathering test by a weatherometer or in a light-resistance test under carbon arc lamps.

EXAMPLE 9

Fifteen parts of 1-amino-4-hydroxy-2-p-methyl-phenoxyanthraquinone, 10 parts of N-chloromethyl-α-phenylmaleimide and 3 parts of zinc chloride were added to 80 parts of dichloroethane, followed by heating under reflux for 7 hours while shielding the reaction system from light and moisture. The reaction mixture was cooled and then poured into 1000 parts of methanol. The precipitated solid was collected by filtration and then dried, whereby 7 parts of the compound represented by the following formula (31):

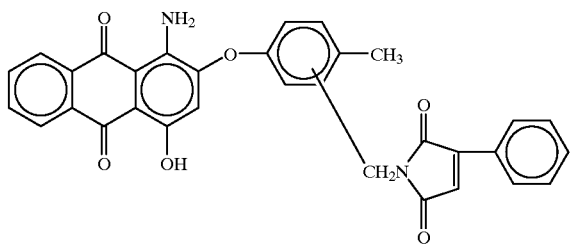

(31)

λ max = 512 nm
ε g= 2.5 X 10⁴ ml/g·cm (solvent: toluene)

were obtained.
Elemental analysis for $C_{32}H_{22}N_2O_6$:

TABLE 5

|  | C | H | N |
|---|---|---|---|
| Calculated (%) | 72.45 | 4.15 | 5.28 |
| Found (%) | 72.43 | 4.20 | 5.29 |

EXAMPLE 10

After 15 parts of 1,4-diamino-2-p-hydroxyethyl-phenylthioanthraquinone were converted to the sodium oxide with sodium hydride, it was reacted at 70° C. for 4 hours in a mixture consisting of 4.5 parts of acrylic chloride and 50 parts of pyridine. The reaction mixture was poured into 500 parts of water. The precipitated solid was collected by filtration and then dried. By chromatographic purification on a column, were obtained 10 parts of the compound represented by the following formula (32):

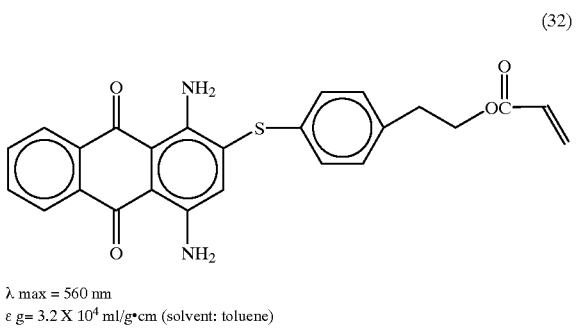

(32)

λ max = 560 nm
ε g= 3.2 X 10⁴ ml/g·cm (solvent: toluene)

Elemental analysis for $C_{25}H_{20}N_2O_4S$:

TABLE 6

|  | C | H | N |
|---|---|---|---|
| Calculated (%) | 67.57 | 4.51 | 6.31 |
| Found (%) | 67.59 | 4.55 | 6.33 |

EXAMPLE 11

Twenty parts of 1-amino-2-p-hydroxyethylphenoxy-4-hydroxyanthraquinone were dissolved in 60 parts of pyridine, followed by the dropwise addition of 11 parts of benzenesulfonyl chloride at 5° C. After they were reacted at 0–5° C. for 20 hours, the reaction mixture was poured into 1000 parts of water. The precipitated solid was collected by filtration and dried, whereby 22 parts of a sulfonate ester were obtained. The sulfonate ester (20 parts) was added to 80 parts of picoline, followed by reaction at 85° C. for 6 hours. The reaction mixture was concentrated in an evaporator so that 25 parts of the quaternary ammonium salt were obtained.

Twenty parts of the quaternary ammonium salt thus obtained, 4 parts of benzaldehyde and 7 parts of piperidine were added to 50 parts of methanol, followed by reaction at 45° C. for 200 hours under shade. The reaction mixture was added dropwise to 1000 parts of diethyl ether to precipitate a solid. The solid was collected by filtration and then dried, whereby 18 parts of the compound represented by the following formula (33) were obtained:

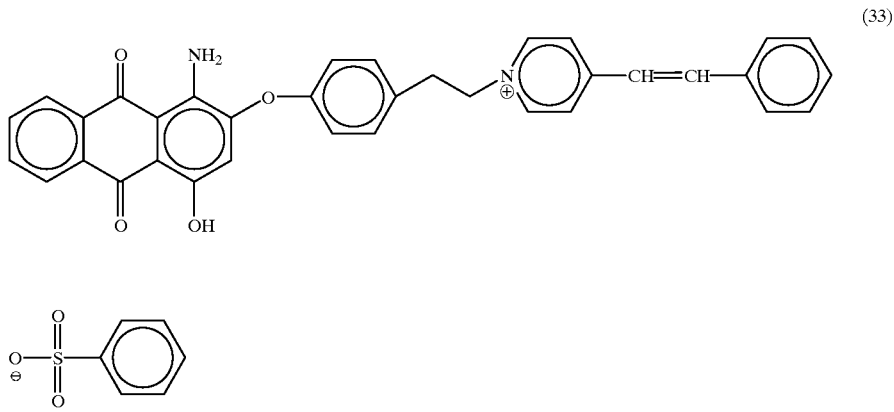

(33)

λ max = 510 nm
ε g= 2.2 X 10⁴ ml/g·cm
(solvent: N,N-dimethylformamide)

Elemental analysis for $C_{41}H_{32}N_2O_7S$

TABLE 7

|  | C | H | N |
|---|---|---|---|
| Calculated (%) | 70.69 | 4.60 | 4.02 |
| Found (%) | 70.70 | 4.65 | 4.08 |

EXAMPLES 12–49

The compounds (D—A—Y) shown in Table 8 were synthesized likewise. Each of color filters fabricated by using the compounds shown in Table 8 was free from color mixing between the colors and had vivid color tone. In addition, no quality deterioration was observed although they were heated to 250° C. during formation of ITO electrodes. Those filter did not undergo deterioration either in a weathering test by a weatherometer or in a light-resistance test under carbon arc lamps. Incidentally, each λmax was measured in N,N-dimethylformamide.

TABLE 8
$$D-(-A-Y_{n^1})_{n^2} \quad (1)$$
| Compd. No. | D | A | Y | $n^1$ | $n^2$ | λ max (nm) |
|---|---|---|---|---|---|---|
| 34 | 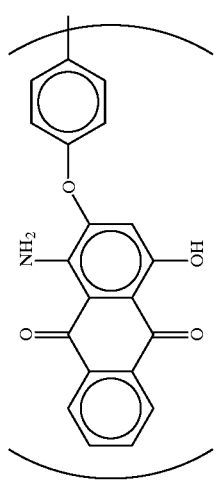 | —(CH$_2$)$_2$— | 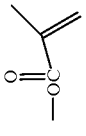 | 1 | 1 | 511 |
| 35 | 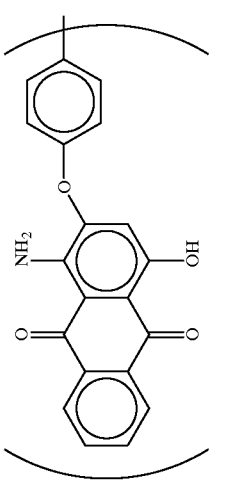 | —(CH$_2$)$_2$— | 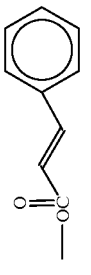 | 1 | 1 | 510 |
| 36 | 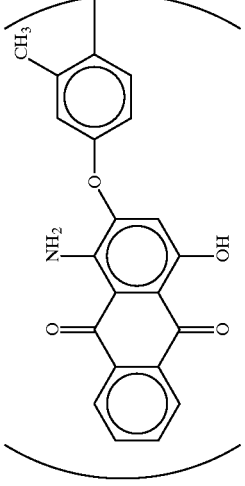 | —(CH$_2$)$_2$— | 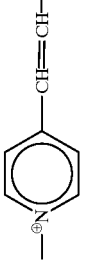 | 1 | 1 | 515 |
| 37 | 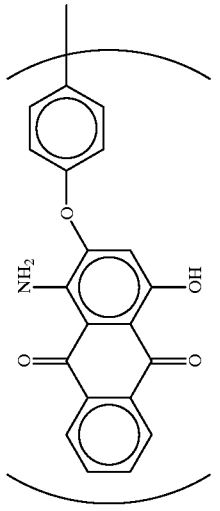 | None |  | 1 | 1 | 511 |

TABLE 8-continued $$D\text{-}(A\text{-}Y_{n^1})_{n^2} \quad (1)$$

| Compd. No. | D | A | Y | $n^1$ | $n^2$ | λ max (nm) |
|---|---|---|---|---|---|---|
| 38 | 1-amino-4-hydroxy-2-(phenylthio)anthraquinone | None | —O—C(=O)—CH=CH₂ (vinyl ester) | 1 | 1 | 530 |
| 39 | 1-amino-2-(3-bromophenylthio)-4-hydroxyanthraquinone | —(CH₂)₂— | 1-methyl-4-[2-(4-methoxyphenyl)vinyl]pyridinium | 1 | 1 | 528 |
| 40 | 1-amino-2-alkoxy-4-hydroxyanthraquinone | 2-methyl-4-ethyl-1,3-dioxane linker (with CH₃) | 1-butyl-4-[2-(4-methylphenyl)vinyl]pyridinium | 1 | 1 | 510 |
| 41 | 1-amino-2-(butoxy)-4-hydroxyanthraquinone | —CH₂— | —O—C(=O)—CH=CH—C₆H₅ (cinnamate) | 1 | 1 | 508 |

TABLE 8-continued $$D(A-Y_{n^1})_{n^2} \quad (1)$$

| Compd. No. | D | A | Y | $n^1$ | $n^2$ | λ max (nm) |
|---|---|---|---|---|---|---|
| 42 | 1-amino-4-hydroxy-2-(alkyloxy)anthraquinone | —CH$_2$— | −C$_6$H$_4$−N(CH$_3$)−C$_6$H$_4$−CH=CH− (with 4-CH$_3$ phenyl via stilbene linkage) | 1 | 1 | 509 |
| 43 | 1,4-diamino-2-(arylthio)anthraquinone | None | −OC(=O)−CH=CH−C$_6$H$_5$ | 1 | 1 | 558 |
| 44 | 1,4-diamino-2-(arylthio)anthraquinone | None | −OC(=O)−CH=CH−C$_6$H$_4$−OCH$_3$ | 1 | 1 | 560 |
| 45 | 1,4-diamino-2-(arylthio)anthraquinone | None | −CH=CHCOO−C$_6$H$_4$−OCH$_3$ | 1 | 1 | 559 |

TABLE 8-continued $$D\text{-}(A\text{-}Y_{n^1})_{n^2} \quad (1)$$

| Compd. No. | D | A | Y | $n^1$ | $n^2$ | $\lambda$ max (nm) |
|---|---|---|---|---|---|---|
| 46 | 1,4-diamino-2-(4-ethylphenylthio)anthraquinonyl | $-CH_2-$ | N-phenylmaleimide | 1 | 1 | 561 |
| 47 | 1-(phenylamino)-4-hydroxyanthraquinonyl | None | $-OC(=O)-CH=CH_2$ | 1 | 1 | 550 |
| 48 | 1,5-bis(phenylamino)anthraquinonyl | None | $-OC(=O)-CH=CH-\text{phenyl}$ | 1 | 2 | 550 |

TABLE 8-continued $$D\text{-}(A\text{-}Y_{n^1})_{n^2} \quad (1)$$

| Compd. No. | D | A | Y | $n^1$ | $n^2$ | λ max (nm) |
|---|---|---|---|---|---|---|
| 49 | [1-(phenylamino)-4-hydroxyanthraquinone] | —CH$_2$— | [N-methyl-3-phenylmaleimide] | 1 | 1 | 551 |
| 50 | [1-(phenylamino)-4-hydroxyanthraquinone] | —(CH$_2$)$_2$— | [N-methyl-4-styrylpyridinium] | 1 | 1 | 550 |
| 51 | [1,5-bis(phenylamino)anthraquinone] | —(CH$_2$)$_2$— | [N-methyl-4-styrylpyridinium] | 1 | 2 | 551 |

TABLE 8-continued $$D \vphantom{)} \!\!-\!\! (\!\!-\!\! A \!\!-\!\! Y_{n^1})_{n^2} \quad (1)$$

| Compd. No. | D | A | Y | $n^1$ | $n^2$ | λ max (nm) |
|---|---|---|---|---|---|---|
| 52 | anthraquinone with two –O–phenyl groups and two NH₂ substituents | None | –O–C(=O)–CH=CH₂ | 1 | 2 | 575 |
| 53 | indole-Cu complex (tetra-substituted) | –O– | –CH=CH–C(=O)–phenyl | 1 | 3 | 697 |
| 54 | 5-bromo-indole-Cu complex with –O–(CH₂)₄– linker | –CH₂– | pyridinium–CH=CH–phenyl | 1 | 4 | 699 |

TABLE 8-continued $$D-(A-Y_{n^1})_{n^2} \quad (1)$$

| Compd. No. | D | A | Y | $n^1$ | $n^2$ | λ max (nm) |
|---|---|---|---|---|---|---|
| 55 | [Cu complex of 4-alkoxy indole, n=4] | [1,3-dioxane with CH₃ and ethyl substituents] | [tolyl-CH=CH-pyridinium-N-C₄H₉] | 1 | 4 | 698 |
| 56 | [VO complex of 4-benzyloxy indole, n=4] | —CH₂— | [N-methyl-3-phenyl-maleimide] | 1 | 4 | 720 |
| 57 | [VO complex of 4-benzyloxy indole, n=4] | —CH₂— | [phenyl-CH=CH-pyridinium-N-methyl] | 1 | 4 | 720 |

TABLE 8-continued

D—(A—Y$n^1$)$n^2$ (1)

| Compd. No. | D | A | Y | $n^1$ | $n^2$ | λ max (nm) |
|---|---|---|---|---|---|---|
| 58 | (Pd-phthalocyanine with phenethoxy substituent)$_4$ | —CH$_2$— | N-methyl-3-(4-methoxyphenyl)maleimide | 1 | 4 | 685 |
| 59 | (TiO-phthalocyanine with bromo and butoxy substituent)$_4$ | —CH$_2$— | —OC(=O)C(CH$_3$)=CH$_2$ | 1 | 4 | 710 |
| 60 | (hydroxy-indanone-quinoline fused structure) | None | —OC(=O)CH=CH-phenyl | 1 | 1 | 448 |

TABLE 8-continued $$D(A-Y_{n^1})_{n^2} \quad (1)$$

| Compd. No. | D | A | Y | $n^1$ | $n^2$ | λ max (nm) |
|---|---|---|---|---|---|---|
| 61 | (hydroxy-isopropyl-quinoline-indandione with phenyl attachment) | —CH$_2$— | (phenyl-substituted maleimide) | 1 | 1 | 450 |
| 62 | (hydroxy-isopropyl-quinoline-indandione with benzoyl-phenyl attachment) | —CH$_2$— | (4-methoxyphenyl-substituted maleimide) | 1 | 1 | 451 |
| 63 | (hydroxy-quinoline-indandione with acyl attachment) | None | (N-ethylpyridinium stilbene with tolyl group) | 1 | 1 | 447 |

TABLE 8-continued $$D \text{---} (A \text{---} Y_{n^1})_{n^2} \quad (1)$$

| Compd. No. | D | A | Y | $n^1$ | $n^2$ | λ max (nm) |
|---|---|---|---|---|---|---|
| 64 | (bromo-hydroxy-pentyl indenoquinoline dione structure) | None | −O−C(=O)−CH=CH$_2$ | 1 | 1 | 451 |
| 65 | (bis-phthalimide structure) | −CH$_2$− | (N-phenyl maleimide structure) | 1 | 2 | 663 |
| 66 | (bis-phthalimide structure) | None | −O−C(=O)−CH=CH−(phenyl) | 1 | 2 | 680 |

TABLE 8-continued $$D \text{-} (A \text{-} Y_{n^1})_{n^2} \quad (1)$$

| Compd. No. | D | A | Y | $n^1$ | $n^2$ | λ max (nm) |
|---|---|---|---|---|---|---|
| 67 | (anthraquinone-fused diaminoanthraquinone structure) | —CH$_2$— | (N-substituted 3-(4-bromophenyl)maleimide) | 1 | 1 | 580 |
| 68 | (3-cyano-4-methyl-1-butyl-6-hydroxy-5-(phenylazo)pyridin-2(1H)-one) | None | —OC(=O)—CH=CH$_2$ | 1 | 1 | 460 |
| 69 | (1,4-diamino-N-(4-substituted phenyl)anthraquinone-2,3-dicarboximide) | —CH$_2$— | (N-substituted 3-phenylmaleimide) | 1 | 1 | 585 |

TABLE 8-continued $$D\text{-}(A\text{-}Y_{n^1})_{n^2} \quad (1)$$

| Compd. No. | D | A | Y | $n^1$ | $n^2$ | λ max (nm) |
|---|---|---|---|---|---|---|
| 70 | anthracenedione-pyrrolidinedione with two NH₂ groups (attached via N) | None | 4-methylphenyl–CH=CH–pyridinium–C₃H₇ | 1 | 1 | 583 |
| 71 | anthracenedione-pyrrolidinedione with two NH₂ groups and N-phenyl substituent | –CH₂– | N-methylpyridinium–CH=CH–phenyl | 1 | 1 | 584 |

EXAMPLE 50

After 20 parts of 1,4-diamino-2-p-hydroxyphenyl-thioanthraquinone were converted to the sodium oxide with sodium hydride, it was reacted at 70° C. for 3 hours in a mixture consisting of 5.5 parts of terephthaloyl dichloride and 90 parts of pyridine. The reaction mixture was poured into 500 parts of an aqueous methanol solution. The precipitated solid was collected by filtration and then dried. By chromatographic purification on a column, were obtained 13 parts of the compound represented by the following formula (72):

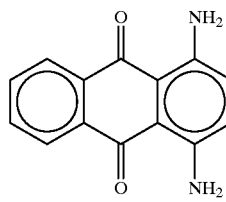

λ max = 560 nm
ε g= 3.1 X 10$^4$ ml/g·cm (solvent: toluene)

Elemental analysis for $C_{52}H_{36}N_2O_{12}$ (Mw: 880)

TABLE 10

|  | C | H | N |
| --- | --- | --- | --- |
| Calculated (%) | 70.91 | 4.09 | 3.18 |
| Found (%) | 70.95 | 4.18 | 3.16 |

EXAMPLE 52

Ten parts of 3-nitrophthalonitrile, 18 parts of ethylene glycol and 2.3 parts of 60% sodium hydride were added to 150 parts of dimethylformamide and heated to 120° C., followed by reaction for 10 hours. The reaction mixture was poured into 1000 parts of 5% hydrochloric acid solution, followed by extraction with 400 parts of chloroform. The resulting extract was purified by column chromatography (eluent: chloroform-methanol). The compound so purified (5 parts), 0.7 part of cuprous chloride, 4 parts of diazabicyclo undecene and 50 parts of n-amyl alcohol were mixed, followed by reaction for 5 hours under reflux. Amyl alcohol was distilled off under reduced pressure from the reaction mixture, followed by purification by column chromatography. Three parts of the purified product and 2.3 part of benzoic chloride were reacted at 70° C. for 3 hours in 30 parts of pyridine. The reaction mixture was poured into 500 parts of water. The resulting precipitate was collected by filtration, dried and then purified by column chromatography, whereby 2.5 parts of the compound represented by the following formula (74) were obtained:

Elemental analysis for $C_{48}H_{30}N_4O_8S_2$ (Mw: 854)

TABLE 9

|  | C | H | N |
| --- | --- | --- | --- |
| Calculated (%) | 67.45 | 3.51 | 6.56 |
| Found (%) | 67.48 | 3.59 | 6.53 |

EXAMPLE 51

After 20 parts of 1-amino-2-p-hydroxyethyl-phenoxy-4-hydroxyanthraquinone were converted to the sodium oxide with sodium hydride, it was reacted at 70° C. for 3 hours in a mixture consisting of 4.9 parts of terephthaloyl dichloride and 90 parts of pyridine. The reaction mixture was poured into 500 parts of an aqueous methanol solution. The precipitated solid was collected by filtration and then dried. By chromatographic purification on a column, were obtained 8 parts of the compound represented by the following formula (73):

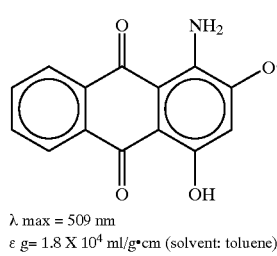

λ max = 509 nm
ε g= 1.8 X 10$^4$ ml/g·cm (solvent: toluene)

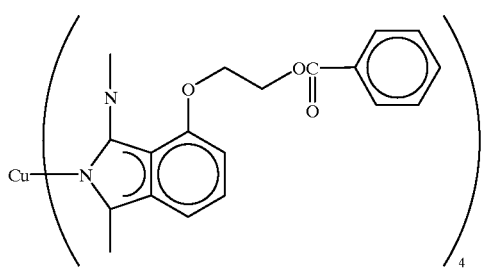

(74)

λ max = 699 nm
ε g= 2.1 X 10⁴ ml/g·cm (solvent: toluene)

Elemental analysis for $C_{68}H_{48}N_8O_{12}Cu$ (Mw: 864)

TABLE 11

|  | C | H | N |
|---|---|---|---|
| Calculated (%) | 66.26 | 3.90 | 9.09 |
| Found (%) | 66.23 | 3.95 | 9.11 |

EXAMPLE 53

The dye (3.2 parts) of the formula (72) and 80 parts of a 20% solution of a stilbazole photosensitive resin in polyvinyl alcohol were mixed. A color filter substrate with black stripes of 20 μm wide was spin-coated to a thickness of 3 μm with the resulting mixture. After photomasked, the substrate was exposed to ultraviolet rays under a halogen lamp. The uncured parts were washed off, whereby a blue filter layer was formed. In a similar manner, red and green filter layers were formed using the compound (73) and the compound (74), respectively.

The thus-obtained filter for a color LCD was free of color mixing between the individual colors and hence had vivid color tones. In addition, no quality deterioration was observed although it was heated to 250° C. during formation of ITO electrodes. The filter did not undergo deterioration either in a weathering test by a weatherometer or in a light-resistance test under carbon arc lamps.

In Table 12, characteristics of the color filter fabricated in Example 53 are presented in comparison with those of the color filter fabricated in Comparative Example 1.

TABLE 12

| Dye migration | Example 53<br>Not observed | Comp.Ex. 1<br>Observed |
|---|---|---|
| Transmittance characteristics | | |
| Red | A | B |
| Green | A | B |
| Blue | A | C |
| Moistureproofness | | |
| Red | A | C |
| Green | A | B |
| Blue | A | C |
| Light resistance | | |
| Red | A | B |
| Green | A | B |
| Blue | A | C |

TABLE 12-continued

| Dye migration | Example 53<br>Not observed | Comp.Ex. 1<br>Observed |
|---|---|---|
| Heat resistance | | |
| Red | A | C |
| Green | A | B |
| Blue | A | C |

EXAMPLE 54

Fifteen parts of 1,4-diamino-2,3-dichloroantraquinone, 13 parts of p-dibutylaminophenol, 8.1 parts of potassium carbonate-and 70 parts of dimethylformamide were reacted at 120° C. for 10 hours. The reaction mixture was poured into 500 parts of 5% hydrochloric acid solution, followed by extraction with 300 parts of chloroform. The extract was purified by column chromatography (eluent: chloroform-methanol), whereby 9 parts of the compound represented by the following formula (75) were obtained:

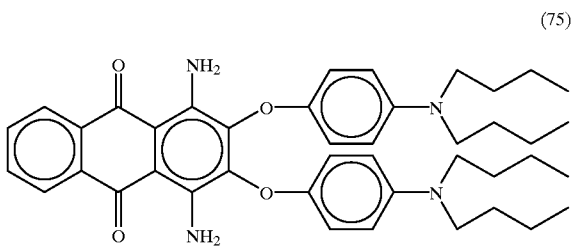

(75)

λ max = 521 nm
ε g= 1.7 X 10⁴ ml/g·cm (solvent: toluene)

Elemental analysis for $C_{42}H_{52}N_4O_4$ (MW: 676)

TABLE 13

|  | C | H | N |
|---|---|---|---|
| Calculated (%) | 74.56 | 7.69 | 8.28 |
| Found (%) | 74.53 | 7.75 | 8.31 |

EXAMPLE 55

Fifteen parts of the below-described compound having the formula (76) were converted to the acid chloride with thionyl chloride in toluene, followed by reaction with 15 parts of ditolylamine at 90° C. for 4 hours. After the reaction mixture was concentrated in an evaporator, the residue was purified by column chromatography, thereby 10 parts of the compound represented by the following formula (77) were obtained.

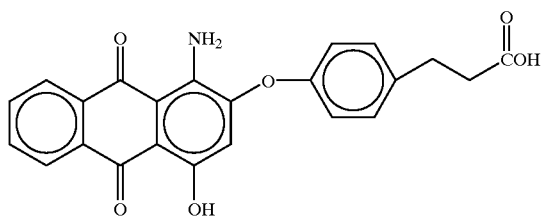

(76)

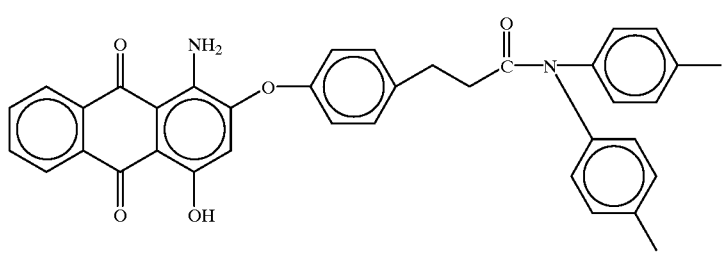

(77)

λ max = 509 nm
ε g= 1.4 X 10⁴ ml/g•cm (solvent: toluene)

Elemental analysis for $C_{37}H_{30}N_2O_5$ (Mw: 582)

TABLE 14

|  | C | H | N |
|---|---|---|---|
| Calculated (%) | 76.29 | 5.16 | 4.81 |
| Found (%) | 76.31 | 5.22 | 4.83 |

EXAMPLE 56

3Parts of the dye of formula (75) and 30 parts of "SD-17" (product of Dainippon Ink & Chemicals, Inc.) were mixed. A color filter substrate with black stripes of 20 μm wide was spin-coated to a thickness of 3 μm with the resulting mixture. After being photomasked, the substrate was exposed to ultraviolet rays under a halogen lamp. The uncured parts were washed off, whereby a blue filter layer was formed. In a similar manner, a red filter layer was formed using the compound (77).

The thus-fabricated filter was free of color mixing between the individual colors and hence had vivid color tones. In addition, no quality deterioration was observed although it was heated to 250° C. during formation of ITO electrodes. The filter did not undergo deterioration either in a weathering test by a weatherometer or in a light-resistance test under carbon arc lamps.

EXAMPLES 57–101

The compounds (D—E—D) shown in Table 15 were synthesized in a similar manner to Examples 51–52. The compounds (D—B—Z) represented in Table 16 were synthesized in a similar manner to Examples 54–55. Each of color filters fabricated by using the compounds was free from color mixing between the colors and had vivid color tone. In addition, no quality deterioration was observed although they were heated to 250°C. during formation of ITO electrodes. Those filter did not undergo deterioration either in a weathering test by a weatherometer or in a light-resistance test under carbon arc lamps. Incidentally, each $\lambda_{max}$ was measured in toluene.

TABLE 15

| Cmpd. No. | D | E | λ max (nm) |
|---|---|---|---|
| 78 |  |  | 510 |

TABLE 15-continued

| Cmpd. No. | D | E | λ max (nm) |
|---|---|---|---|
| 79 | 1-NH₂, 2-O-(4-ethylphenyl), 4-OH anthraquinone | —OC(O)NH-CH₂CH₂-NHC(O)O— | 511 |
| 80 | 1-NH₂, 2-O-(4-methylphenyl), 4-OH anthraquinone | —OC(O)-(CH₂)₃-C(O)O— | 512 |
| 81 | 1-NH₂, 2-O-(4-methylphenyl), 4-OH anthraquinone | —OC(O)-C₆H₄-CH₂CH₂-OC(O)— | 509 |
| 82 | 1-NH₂, 2-S-(4-methylphenyl), 4-NH₂ anthraquinone | —OC(O)-CH₂-CH(CH₃)-OC(O)— | 531 |
| 83 | 1-NH₂, 2-S-(4-methylphenyl), 4-NH₂ anthraquinone | —OC(O)-C₆H₄-C(O)O— | 530 |
| 84 | 1-NH₂, 2-S-(4-methylphenyl), 4-NH₂ anthraquinone | —OC(O)-CH₂CH₂-C(O)O— | 529 |
| 85 | 1-NH₂, 2-S-ethyl, 4-NH₂ anthraquinone | —OC(O)-(CH₂)₄-OC(O)— | 532 |

TABLE 15-continued

| Cmpd. No. | D | E | λ max (nm) |
|---|---|---|---|
| 86 | 1-(4-methylphenylamino)-4-hydroxyanthraquinone | 4-(2-acyloxyethyl)phenyl diester | 513 |
| 87 | 1-(4-methylphenylamino)-4-hydroxyanthraquinone | terephthalate diester | 512 |
| 88 | 1,4-diamino-2-(ethylthio)anthraquinone | ethylenediamine dicarbamate | 530 |
| 89 | 1,4-diamino-2-(3-methylphenylthio)anthraquinone | propylene glycol dicarbonate | 533 |
| 90 | 3-hydroxy-2-(methylindanedionyl)quinoline | 4-(2-acyloxyethyl)phenyl diester | 449 |
| 91 | 3-hydroxy-2-(methylindanedionyl)quinoline | 1,4-phenylenediamine dicarboxamide | 450 |
| 92 | 4-bromo-3-hydroxy-6-isopropyl-2-(methylindanedionyl)quinoline | succinate diester | 451 |

TABLE 15-continued

| Cmpd. No. | D | E | λ max (nm) |
|---|---|---|---|
| 93 | (indigo-type structure) | (terephthaloyl) | 613 |
| 94 | (indigo-type structure) | —CH$_2$— | 611 |
| 95 | (anthrapyridone diamino N-tolyl imide) | (dimethyl terephthalate linker) | 581 |
| 96 | (anthrapyridone diamino N-tolyl imide) | (2-methylpropane-1,3-diyl diester linker) | 580 |
| 97 | [Cu(indole)$_4$] complex | (terephthaloyl) | 699 |
| 98 | [Cu(indole)$_4$] complex | —CH$_2$— | 698 |

TABLE 16

$$D\text{---}(B\text{---}Z)_m$$

| Cmpd. No. | D | B | Z | m | λ max (nm) |
|---|---|---|---|---|---|
| 99 | (4-bromo-3-hydroxy-6-isopropylquinoline-2-yl indane-1,3-dione) | None | —C(=O)—N(phenyl)₂ | 1 | 449 |
| 100 | (Cu bis-indazole with OCH₂— substituent)₄ | —CH₂— | —O—C(=O)—CH₂CH₂CH₃ | 4 | 699 |
| 101 | (Cu bis-indazole with OCH₂— substituent)₄ | —CH₂— | —O—C(=O)—O—CH₂CH₂CH₃ | 4 | 698 |
| 102 | (Cu bis-indazole with O—CH₂-phenyl substituent)₄ | None | —O—C(=O)-phenyl | 4 | 698 |
| 103 | (VO bis-indazole with OCH₂— substituent)₄ | —CH₂— | —N(pentyl)(butyl) piperidine | 4 | 722 |
| 104 | (VO bis-indazole with O—CH₂CH₂-phenyl substituent)₄ | None | —O—C(=O)—CH₂—CH(CH₃)₂ | 4 | 720 |

TABLE 16-continued

D—(B—Z)$_m$

| Cmpd. No. | D | B | Z | m | λ max (nm) |
|---|---|---|---|---|---|
| 105 | (Pd-indole-O-CH₂CH₂-phenyl-)₄ | None | —OC(O)OCH(CH₃)CH₂CH(CH₃)₂ | 4 | 693 |
| 106 | (Pd-indole(Br)-O-(CH₂)₃-)₄ | —CH₂— | N-piperidinyl | 4 | 694 |
| 107 | (TiO-indole-O-CH₂-phenyl-)₄ | —CH₂— | —OC(O)CH(CH₃)CH(Br)CH₃ | 4 | 710 |
| 108 | bis-indolinone (indigo-type) | None | —C(O)N(phenyl)₂ | 2 | 660 |
| 109 | phenyl-N=N-(pyridinone with CH₃, CN, OH, C₂H₅) | None | —C(O)N(3-Br-4-methylphenyl)₂ | 1 | 460 |
| 110 | bis(benzo[b]thiophen-3(2H)-one-2-ylidene) | None | —OC(O)N(CH₂phenyl)₂ | 2 | 543 |

TABLE 16-continued

D―(B―Z)$_m$

| Cmpd. No. | D | B | Z | m | λ max (nm) |
|---|---|---|---|---|---|
| 111 | 1-amino-4-hydroxy-2-(3-bromophenoxy)anthraquinone | | benzoate (—O—C(=O)—C$_6$H$_5$) | 1 | 510 |
| 112 | 1-amino-4-hydroxy-2-(bromophenoxy)anthraquinone | | 4-chlorobenzoate | 1 | 512 |
| 113 | 1-amino-4-hydroxy-2-phenoxyanthraquinone | | N,N-di(4-methylphenyl)amino | 1 | 510 |
| 114 | 1-amino-4-hydroxy-2-phenoxyanthraquinone | None | N,N-bis(4-bromobenzyl)amino | 1 | 511 |
| 115 | 1,4-diamino-2-(phenylthio)anthraquinone | None | 4-bromobenzoate | 1 | 531 |
| 116 | 1,4-diamino-2-(phenylthio)anthraquinone | None | N,N-di(4-methylphenyl)carbamoyl | 1 | 530 |

TABLE 16-continued

D—(B—Z)$_m$

| Cmpd. No. | D | B | Z | m | λ max (nm) |
|---|---|---|---|---|---|
| 117 | [anthraquinone with NH-phenyl-Br and OH substituents] | None | [C(=O)–N(hexyl)] | 1 | 551 |
| 118 | [1,5-bis(anilino)anthraquinone] | None | [N(hexyl)] | 2 | 550 |
| 119 | [1,5-bis(anilino)anthraquinone] | None | [–O–C(=O)–phenyl] | 2 | 549 |
| 120 | [diaminoanthraquinone imide with N-phenyl] | None | [–O–C(=O)–N(4-tolyl)$_2$] | 1 | 580 |
| 121 | [isopropyl-hydroxyquinoline-indanedione] | None | [–C(=O)–N(4-bromobenzyl)$_2$] | 1 | 448 |

TABLE 16-continued $$D-(B-Z)_m$$

| Cmpd. No. | D | B | Z | m | λ max (nm) |
|---|---|---|---|---|---|
| 122 | 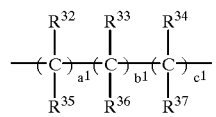 | None | 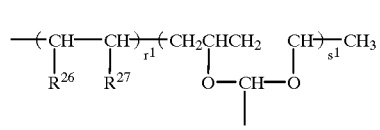 | 1 | 447 |

What is claimed is:

1. An LCD color filter fabricated by curing a photosensitive resist resin composition comprising:

(A) 1–100 weight parts of at least one dye selected from the group consisting of the following dyes (a) or (c):
 (a) dyes containing a photopolymerizable substituent of the formula (1):

$$D-(A-Y_n^1)n^2 \quad (1)$$

wherein D is a chromophoric nucleus,

A denotes a connecting group of one of the formulae (19) to (22), in which parenthesized recurring units may be combined together at random:

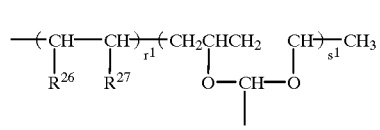 (19)

wherein one of $R^{26}$ and $R^{27}$ represents a hydrogen atom and the other denotes a hydroxyl group; and $r^1$ and $s^1$ each stands for an integer of from 1–10,000;

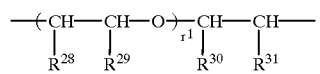 (20)

wherein $R^{28}$ to $R^{31}$ independently represent a hydrogen atom, a substituted or unsubstituted alkyl group, a substituted or unsubstituted cycloalkyl group, a substituted or unsubstituted aryl group, or a halogen atom; and $r^2$ stands for an integer of from 1–10,000;

 (21)

wherein $r^3$ stands for an integer of 1–10,000,

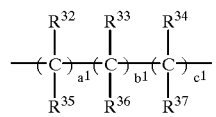 (22)

wherein $R^{32}$ to $R^{37}$ independently represent a hydrogen atom, a halogen atom, a hydroxyl group, —SH, an amino group, a substituted or unsubstituted alkyl group, a substituted or unsubstituted cycloalkyl group, a substituted or unsubstituted aryl group, a substituted or unsubstituted alkoxy group, a substituted or unsubstituted aryloxyl group, a substituted or unsubstituted alkylamino group, or a substituted or unsubstituted arylamino group; and $a^1$, $b^1$ and $c^1$ each stands for an integer of from 0–10,000, Y is a photopolymerizable group of one of the formulae (2)–(7)

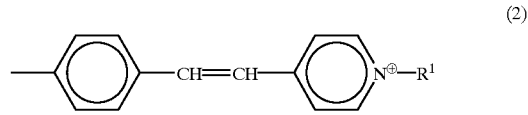 (2)

 (3)

 (4)

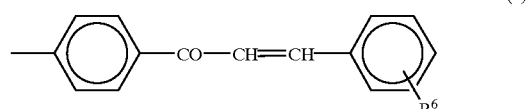 (5)

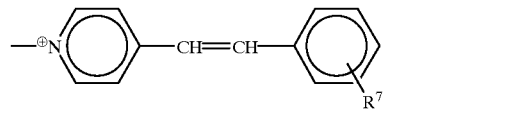 (6)

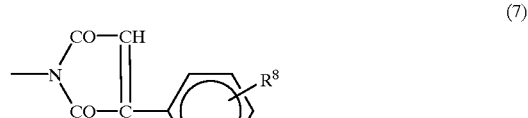 (7)

wherein $R^1$ to $R^4$ independently represent a substituted or unsubstituted alkyl group, a substituted or unsubstituted cycloalkyl group, a substituted or unsubstituted aralkyl group, or a hydrogen atom; $R^5$ represents a substituted or unsubstituted alkyl group, a substituted or unsubstituted cycloalkyl group, a substituted or unsubstituted aryl group, or a substituted or unsubstituted aralkyl group, or a hydrogen atom; $R^5$ is a hydrogen atom or a methyl group, provided that if $R^5$ is a methyl group, then $R^5$ is a hydrogen atom; and $R^6$, $R^7$ and $R^8$ independently represent a substituted or unsubstituted alkyl group, a substituted or unsubstituted cycloalkyl group, a substituted or unsubstituted alkoxy group, a halogen atom, or a hydrogen atom, $n^1$ is 1–10,000 and $n^2$ is 1–10, (c) dyes for color filters, said dyes having a molecular weight of at least 500 but not greater than 4000 and represented by the following formula (9):

D—E—D  (9)

wherein D represents a chromophoric nucleus and E denotes a connecting group of one of the formulae —F—OCO—G—COO—F—, —F—COO—G—OOC—F—, —F—CONH—G—NHCO—F—, —F—OCONH—G—NHCOO—F— and —F—OCOO—G—OCOO—F— where F and G are divalent connecting groups selected from formulae (20) to (22) above in which $r^1$ to $r^3$, $s^1$, $a^1$, $b^1$ and $c^1$ each stands for an integer of from 1–100, or formula (23):

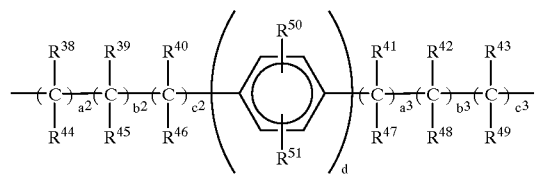

(23)

wherein $R^{38}$ to $R^{49}$ independently represent a hydrogen atom, a substituted or unsubstituted alkyl group, a substituted or unsubstituted cycloalkyl group, a substituted or unsubstituted aryl group, or a halogen atom; $R^{50}$ and $R^{51}$ independently represent a hydrogen atom, a substituted or unsubstituted alkyl group, a substituted or unsubstituted cycloalkyl group, a substituted or unsubstituted aryl group, a substituted or unsubstituted alkoxy group, or a halogen atom; $a^2$, $b^2$, $c^2$, $a^3$, $b^3$ and $c^3$ each stands for an integer of from 0–100; and d stands for an integer of 1–5; and provided that each chromophoric nucleus D in formulae (1) and (9) is independently an anthraquinone, phthalocyanine, quinophthalone or pyridoneazo residue, and (B) 100 weight parts of a photosensitive resist resin.

2. The filter of claim 1, wherein the photosensitive resist resin contains photosensitive groups selected from the group consisting of the following formulas (10) to (15):

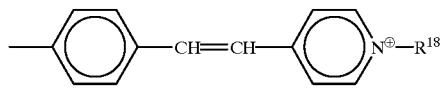

(10)

-continued

(11)

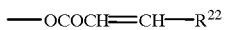

(12)

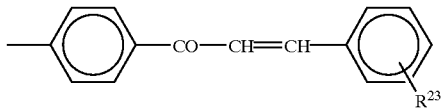

(13)

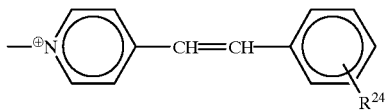

(14)

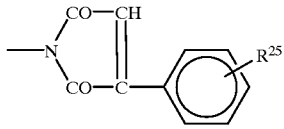

(15)

wherein $R^{18}$ to $R^{21}$ independently represent a substituted or unsubstituted alkyl group, a substituted or unsubstituted cycloalkyl group, a substituted or unsubstituted aralkyl group, or a hydrogen atom, $R^{22}$ denotes a substituted or unsubstituted alkyl group, a substituted or unsubstituted cycloalkyl group, a substituted or unsubstituted aryl group, a substituted or unsubstituted aralkyl group or a hydrogen atom, and $R^{23}$ to $R^{25}$ independently mean a substituted or unsubstituted alkyl group, a substituted or unsubstituted cycloalkyl group, a substituted or unsubstituted alkoxy group, a halogen atom or a hydrogen atom.

3. The LCD color filter of claim 2, wherein the photosensitive resist resin contains at least one photosensitive group selected from the group consisting of those of the formulae (10), (11), (13), (14) or (15).

4. The LCD color filter of claim 1, wherein each chromophoric nucleus D is independently selected from an anthraquinone nucleus of one of the formulae (i) to (iii), (vii) and (viii):

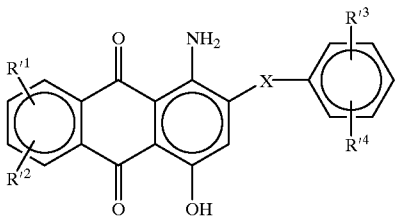

(i)

wherein X is an oxygen or sulfur atom, $R'^1$ to $R'^1$ each are independently a hydrogen atom, a substituted or unsubstituted alkyl group, a substituted or unsubstituted alkoxy group or a halogen atom;

(ii)

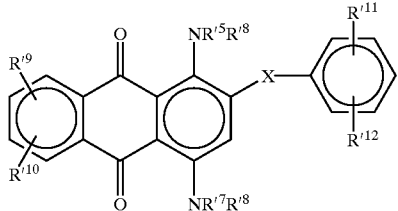

wherein X is an oxygen or sulfur atom, $R'^5$ to $R'^8$ each are independently a substituted or unsubstituted alkyl group, a substituted or unsubstituted cycloalkyl group, a substituted or unsubstituted aryl group or a hydrogen atom, $R'^9$ to $R'^{12}$ each are independently a hydrogen atom, substituted or unsubstituted alkyl group, a substituted or unsubstituted alkoxy group or a halogen atom;

(iii)

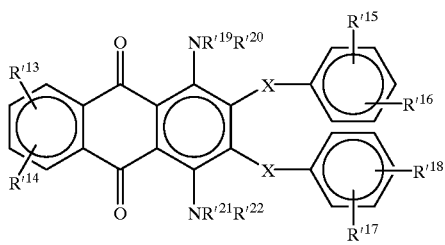

wherein X is an oxygen or sulfur atom, $R'^{13}$ to $R'^{18}$ each are independently a hydrogen atom, a substituted or unsubstituted alkyl group, a substituted or unsubstituted alkoxy group or a halogen atom, $R'^{19}$ to $R'^{22}$ each are independently a substituted or unsubstituted cycloalkyl group, a substituted or unsubstituted aryl group or a hydrogen atom;

(vii)

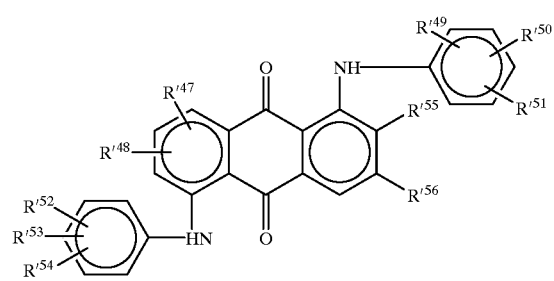

wherein $R'^{47}$ to $R'^{54}$ each are independently a hydrogen atom, a substituted or unsubstituted alkyl group, substituted or unsubstituted alkoxy group, a substituted or unsubstituted cycloalkyl group or a halogen atom, $R'^{55}$ and $R'^{56}$ each are independently a substituted or unsubstituted alkyl group, a substituted or unsubstituted alkoxy group, a cyano group, a halogen atom or a hydrogen atom;

(viii)

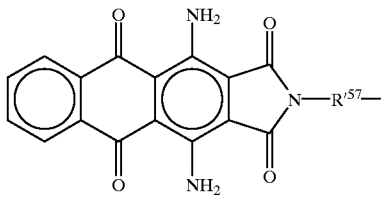

wherein $R'^{57}$ is a substituted or unsubstituted alkyl group or a substituted or unsubstituted aryl group; or a phthalocyanine nucleus of formula (ix):

(ix)

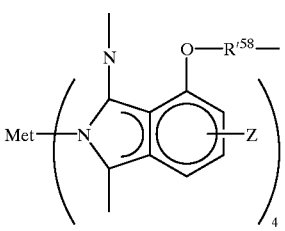

wherein $R'^{58}$ is a substituted or unsubstituted alkyl group, a substituted or unsubstituted aryl group or a substituted or unsubstituted aralkyl group, Met is a divalent metal, a trivalent mono-substituted metal, a tetravalent di-substituted metal or a metal oxide, and Z is a hydrogen or halogen atom.

5. The LCD color filter of claim 1, wherein the dye is a dye selected from dyes (a).

6. The LCD color filter of claim 1, wherein the dye is a dye selected from dyes (c).

7. The LCD color filter of claim 1, wherein the dye, (A), is soluble in the resin, (B), and is immobilized in the resin.

* * * * *

UNITED STATES PATENT AND TRADEMARK OFFICE
CERTIFICATE OF CORRECTION

PATENT NO. : 6,306,550 B1
DATED : October 23, 2001
INVENTOR(S) : Hisato Itoh et al.

It is certified that error appears in the above-identified patent and that said Letters Patent is hereby corrected as shown below:

Column 72,
Line 64, reads "$R'^1$ to $R'^1$" should read -- $R'^1$ to $R'^4$ --

Signed and Sealed this

Twenty-second Day of March, 2005

JON W. DUDAS
*Director of the United States Patent and Trademark Office*